(12) United States Patent
Itakura et al.

(10) Patent No.: US 10,171,067 B2
(45) Date of Patent: Jan. 1, 2019

(54) WAVEFORM SHAPING FILTER, INTEGRATED CIRCUIT, RADIATION DETECTION DEVICE, METHOD FOR ADJUSTING TIME CONSTANT OF WAVEFORM SHAPING FILTER, AND METHOD FOR ADJUSTING GAIN OF WAVEFORM SHAPING FILTER

(71) Applicant: KABUSHIKI KAISHA TOSHIBA, Minato-Ku, Tokyo (JP)

(72) Inventors: Tetsuro Itakura, Nerima Tokyo (JP); Masanori Furuta, Odawara Kanagawa (JP); Shunsuke Kimura, Kawasaki Kanagawa (JP); Hideyuki Funaki, Shinagawa Tokyo (JP); Go Kawata, Kawasaki Kanagawa (JP); Hirokatsu Shirahama, Yokohama Kanagawa (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 336 days.

(21) Appl. No.: 15/053,933

(22) Filed: Feb. 25, 2016

(65) Prior Publication Data
US 2016/0269006 A1   Sep. 15, 2016

(30) Foreign Application Priority Data

Mar. 13, 2015   (JP) ................. 2015-051422

(51) Int. Cl.
*H03K 5/00*   (2006.01)
*H03K 5/04*   (2006.01)
(Continued)

(52) U.S. Cl.
CPC ............ *H03K 5/04* (2013.01); *G01J 1/44* (2013.01); *H03G 3/30* (2013.01); *H03H 11/126* (2013.01);
(Continued)

(58) Field of Classification Search
CPC .......... H03K 5/04; H03K 5/1532; H03K 5/24; G01J 1/44; H03H 11/1213; H03H 11/126
(Continued)

(56) References Cited

U.S. PATENT DOCUMENTS

| 4,491,799 A | 1/1985 | Giardinelli |
| 4,866,400 A | 9/1989 | Britton et al. |

(Continued)

FOREIGN PATENT DOCUMENTS

| JP | 02129702 | 5/1990 |
| JP | 04003625 A | 1/1992 |

(Continued)

*Primary Examiner* — Dinh T Le
(74) *Attorney, Agent, or Firm* — Holtz, Holtz & Volek PC

(57) ABSTRACT

A waveform shaping filter according to an embodiment includes at least one filter stage and a control circuit. The filter stage includes a differentiation signal generation circuit, a proportional signal generation circuit, and an adder circuit. The differentiation signal generation circuit generates a differentiation signal obtained by amplifying a differentiation component of an input signal. The proportional signal generation circuit generates a proportional signal obtained by amplifying the input signal. The adder circuit outputs an output signal obtained by adding the proportional signal and the differentiation signal. The control circuit compares the output signal and a first detection level, detects at least one of an overshoot and an undershoot of the output signal, and controls a time constant of the filter stage, based on a detection result.

21 Claims, 23 Drawing Sheets

(51) Int. Cl.
  *H03K 5/24* (2006.01)
  *H03K 5/1532* (2006.01)
  *G01J 1/44* (2006.01)
  *H03H 11/12* (2006.01)
  *H03G 3/30* (2006.01)

(52) U.S. Cl.
  CPC ....... *H03H 11/1213* (2013.01); *H03K 5/1532* (2013.01); *H03K 5/24* (2013.01)

(58) Field of Classification Search
  USPC .................................................. 327/551–559
  See application file for complete search history.

(56) References Cited

U.S. PATENT DOCUMENTS

| | | | |
|---|---|---|---|
| 5,126,688 A | 6/1992 | Nakanishi et al. | |
| 5,572,163 A | 11/1996 | Kimura et al. | |
| 5,821,533 A | 10/1998 | Bingham et al. | |
| 5,872,363 A | 2/1999 | Bingham et al. | |
| 6,295,508 B1 | 9/2001 | Trammell et al. | |
| 6,347,288 B1 | 2/2002 | Trammell et al. | |
| 6,374,192 B1 | 4/2002 | Brogle et al. | |
| 6,552,611 B2 | 4/2003 | Yamamoto | |
| 7,002,314 B2 | 2/2006 | Arakawa et al. | |
| 7,477,099 B2 * | 1/2009 | Okamoto | H03G 5/16 327/552 |
| 7,761,067 B1 * | 7/2010 | Tsai | H03H 7/12 455/114.2 |
| 7,865,087 B2 * | 1/2011 | Inoue | H03F 3/087 327/553 |
| 7,894,727 B2 * | 2/2011 | Inoue | H03F 3/087 330/258 |
| 8,988,267 B1 | 3/2015 | Kimura et al. | |
| 9,160,939 B2 | 10/2015 | Funaki et al. | |
| 2015/0130538 A1 | 5/2015 | Itakura et al. | |
| 2015/0137858 A1 | 5/2015 | Itakura et al. | |
| 2015/0160677 A1 | 6/2015 | Furuta et al. | |
| 2015/0263679 A1 | 9/2015 | Itakura et al. | |
| 2015/0270840 A1 | 9/2015 | Itakura et al. | |
| 2015/0349753 A1 | 12/2015 | Itakura et al. | |
| 2016/0211830 A1 | 7/2016 | Itakura et al. | |

FOREIGN PATENT DOCUMENTS

| | | | |
|---|---|---|---|
| JP | 07202632 A | | 8/1995 |
| JP | 2001274641 A | | 10/2001 |
| JP | 2003061377 A | | 2/2003 |
| JP | 2005067400 A | | 3/2005 |
| JP | 02008182414 A | * | 8/2008 |
| JP | 2015031683 A | | 2/2015 |
| JP | 2015065531 A | | 4/2015 |
| JP | 2015065532 A | | 4/2015 |
| JP | 2015095830 A | | 5/2015 |
| JP | 2015100036 A | | 5/2015 |
| JP | 2015115654 A | | 6/2015 |
| JP | 2015177193 A | | 10/2015 |
| JP | 2015184074 A | | 10/2015 |
| JP | 2015184119 A | | 10/2015 |
| JP | 2015194457 A | | 11/2015 |
| JP | 2015228578 A | | 12/2015 |
| JP | 2016034097 A | | 3/2016 |
| JP | 2016136715 A | | 7/2016 |
| WO | 2015141098 A1 | | 9/2015 |
| WO | 2015146595 A1 | | 10/2015 |
| WO | 2016017702 A1 | | 2/2016 |

\* cited by examiner

ID CIRCUIT, RADIATION
WAVEFORM SHAPING FILTER, INTEGRATED CIRCUIT, RADIATION DETECTION DEVICE, METHOD FOR ADJUSTING TIME CONSTANT OF WAVEFORM SHAPING FILTER, AND METHOD FOR ADJUSTING GAIN OF WAVEFORM SHAPING FILTER

CROSS REFERENCE TO RELATED APPLICATION(S)

This application is based upon and claims the benefit of priority from the prior Japanese Patent Application No. 2015-051422, filed on Mar. 13, 2015, the entire contents of which are incorporated herein by reference.

FIELD

Embodiments described herein relate generally to a waveform shaping filter, an integrated circuit, a radiation detection device, a method for adjusting a time constant of a waveform shaping filter, and a method for adjusting a gain of a waveform shaping filter.

BACKGROUND

Waveform shaping filters that can control a time constant have been used to narrow a pulse width of a signal pulse that is output in a state where the pulse width is expanded. As a conventional waveform shaping filter, one that samples a trailing edge of the signal pulse, detects occurrence of an overshoot (or an undershoot) using a sampled value, and controls the time constant based on a detection result has been proposed.

However, there is a problem that this waveform shaping filter requires a sampling circuit for sampling the trailing edge of the signal pulse, a control circuit for generating the sampling pulse, an AD converter for AD-converting the signal pulse at a high speed, and the like, and thus a circuit scale is increased.

DETAILED DESCRIPTION

Embodiments will now be explained with reference to the accompanying drawings. The present invention is not limited to the embodiments.

A waveform shaping filter according to an embodiment includes at least one filter stage and a control circuit. The filter stage includes a differentiation signal generation circuit, a proportional signal generation circuit, and an adder circuit. The differentiation signal generation circuit generates a differentiation signal that is an amplified differentiation component of an input signal. The proportional signal generation circuit generates a proportional signal that is an amplified input signal. The adder circuit outputs an output signal that is an added proportional signal and differentiation signal. The control circuit compares the output signal and a first detection level, detects at least one of an overshoot or an undershoot of the output signal, and controls a time constant of the filter stage, based on a detection result.

(First Embodiment)

Figure 1:
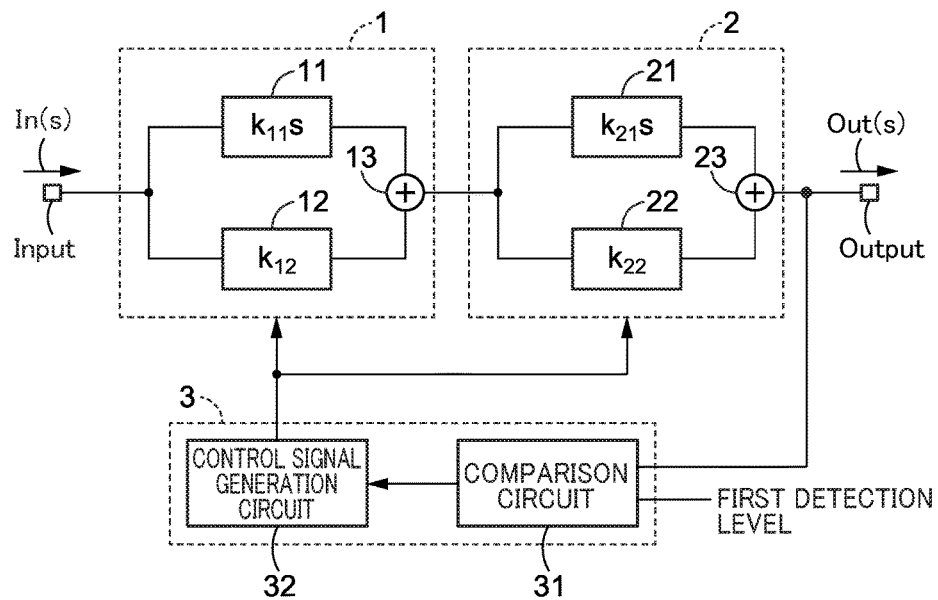
FIG. 1 is a diagram illustrating a waveform shaping filter according to a first embodiment.

A waveform shaping filter according to a first embodiment will be described with reference to FIGS. 1 to 12. FIG. 1 is a diagram illustrating an example of a waveform shaping filter according to the present embodiment. As illustrated in FIG. 1, the waveform shaping filter includes filter stages 1 and 2, and a control circuit 3.

The filter stage 1 is a first filter stage. An input signal In(s) input from an input terminal Input of the waveform shaping filter is input to the filter stage 1. s is a Laplace operator. As illustrated in FIG. 1, the filter stage 1 includes a differentiation signal generation circuit 11, a proportional signal generation circuit 12, and an adder circuit 13.

The differentiation signal generation circuit 11 amplifies a differentiation component of the input signal In(s) by $k_{11}$ times to generate a differentiation signal. The differentiation signal becomes In(s)×$k_{11}$s. The differentiation signal generation circuit 11 inputs the differentiation signal to the adder circuit 13.

The proportional signal generation circuit 12 amplifies the input signal In(s) by $k_{12}$ times to generate a proportional signal. The proportional signal becomes In(s)×$k_{12}$. The proportional signal generation circuit 12 inputs the proportional signal to the adder circuit 13.

The adder circuit 13 receives the differentiation signal from the differentiation signal generation circuit 11, and receives the proportional signal from the proportional signal generation circuit 12. The adder circuit 13 adds the differentiation signal and the proportional signal and outputs an output signal. The output signal of the adder circuit 13 becomes In(s)×($k_{11}$s+$k_{12}$), and becomes an output signal of the filter stage 1. A time constant of the filter stage 1 is $k_{11}/k_{12}$.

The filter stage 2 is a second filter stage connected to the filter stage 1. The output signal of the filter stage 1 is input to the filter stage 2. As illustrated in FIG. 1, the filter stage 2 includes a differentiation signal generation circuit 21, a proportional signal generation circuit 22, and an adder circuit 23.

The differentiation signal generation circuit 21 amplifies a differentiation component of the output signal of the filter stage 1 by $k_{21}$ times to generate a differentiation signal. The differentiation signal becomes In(s)×($k_{11}$s+$k_{12}$)×$k_{21}$s. The differentiation signal generation circuit 21 inputs the differentiation signal to the adder circuit 23.

The proportional signal generation circuit 22 amplifies the output signal of the filter stage 1 by $k_{22}$ times to generate a proportional signal. The proportional signal becomes In(s)×($k_{11}$s+$k_{12}$)×$k_{22}$. The proportional signal generation circuit 22 inputs the proportional signal to the adder circuit 23.

The adder circuit 23 receives the differentiation signal from the differentiation signal generation circuit 21, and receives the proportional signal from the proportional signal generation circuit 22. The adder circuit 23 adds the differentiation signal and the proportional signal, and outputs an output signal. The output signal of the adder circuit 23 becomes In(s)×($k_{11}$s+$k_{12}$)($k_{21}$s+$k_{22}$), and becomes an output signal of the filter stage 2. A time constant of the filter stage 2 is $k_{21}/k_{22}$. The filter stage 2 is the final stage, and thus the output signal of the filter stage 2 becomes an output signal Out(s) of the waveform shaping filter.

$$\text{Out}(s)=\text{In}(s)\times(k_{11}s+k_{12})(k_{21}s+k_{22}) \quad (1)$$

Note that the waveform shaping filter according to the present embodiment may include only one filter stage, or may include three or more filter stages. In either case, the input signal In(s) is input to the first filter stage, and the output signal Out(s) is output from the final filter stage.

The control circuit 3 controls the time constant of the waveform shaping filter, based on the output signal Out(s). As illustrated in FIG. 1, the control circuit 3 includes a comparison circuit 31 and a control signal generation circuit 32.

The comparison circuit 31 receives the output signal Out(s). The comparison circuit 31 compares the output signal Out(s) and a first detection level. The first detection level is a threshold for detecting an undershoot or an overshoot of the output signal Out(s). Hereinafter, a case of detecting the undershoot of the output signal Out(s) will be described. However, the comparison circuit 31 may detect the overshoot of the output signal Out(s). Whether detecting the undershoot or the overshoot of the output signal Out(s) is determined according to a direction (sign) of the input signal In(s). The comparison circuit 31 inputs a comparison result of the output signal Out(s) and the first detection level, that is, a detection result of the undershoot to the control signal generation circuit 32.

The control signal generation circuit 32 generates a control signal that controls the time constant of the waveform shaping filter, based on the detection result input from the comparison circuit 31, and inputs the control signal to at least one of the filter stage 1 and the filter stage 2. The control circuit 3 controls the time constant of the waveform shaping filter according to the control signal.

As described above, the time constant of the filter stage 1 is $k_{11}/k_{12}$. Therefore, the control circuit 3 can control the time constant of the filter stage 1 by adjusting at least one of values of $k_{11}$ and $k_{12}$. Further, the time constant of the filter stage 2 is $k_{21}/k_{22}$.

Therefore, the control circuit 3 can control the time constant of the filter stage 2 by adjusting at least one of values of $k_{21}$ and $k_{22}$.

To be specific, the control circuit 3 can increase the time constant of the waveform shaping filter by increasing the value of $k_{11}$ or $k_{21}$, or decreasing the value of $k_{12}$ or $k_{22}$. Further, the control circuit 3 can decrease the time constant of the waveform shaping filter by decreasing the value of $k_{11}$ or $k_{21}$, or increasing the value of $k_{12}$ or $k_{22}$.

Here, a method for adjusting a time constant of a waveform shaping filter according to the present embodiment will be described. Hereinafter, the input signal In(s) is a signal pulse that irregularly arrives. Further, a signal detection circuit that detects arrival of the input signal In(s) is connected to a subsequent stage of the waveform shaping filter.

The signal detection circuit compares the output signal Out(s) and a second detection level to detect arrival of the input signal In(s). The second detection level is a threshold for detecting arrival of the input signal In(s). The signal detection circuit determines that the input signal In(s) has arrived when the output signal Out(s) larger than the second detection level has been input.

As can be seen from the above-described formula (1), the waveform shaping filter has a zero. Therefore, when the input signal In(s) is input to the waveform shaping filter through a system that has a low pass characteristic having a primary pole, the pulse width of the input signal In(s) can be narrowed by pole-zero cancellation using the zero of the waveform shaping filter.

Figure 2:
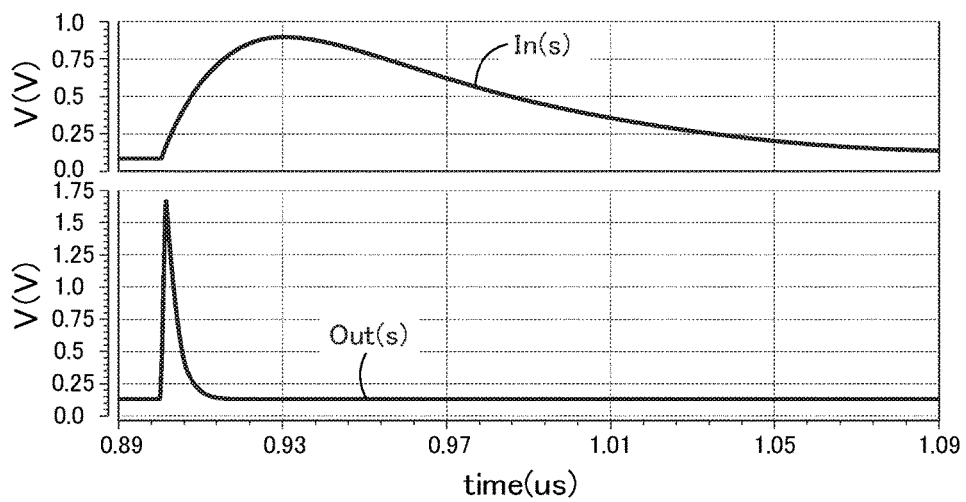
FIG. 2 is a diagram illustrating an example of an input signal and an output signal of the waveform shaping filter of FIG. 1.

When frequencies of the pole and the zero accord with each other, and the pole-zero cancellation has been properly performed, the pulse width of the input signal In(s) that has been unsharpened due to the low pass characteristic of the system is narrowed, as illustrated in FIG. 2. The frequency of the zero depends on the time constant of the waveform shaping filter. Therefore, by appropriately setting the time constant of the waveform shaping filter, the pole-zero cancellation like FIG. 2 becomes possible.

However, in practice, there is a case in which the frequencies of the pole and the zero do not accord with each other, due to variation of elements that configure the waveform shaping filter, and variation of the system that the input signal In(s) passes through.

Figure 3:
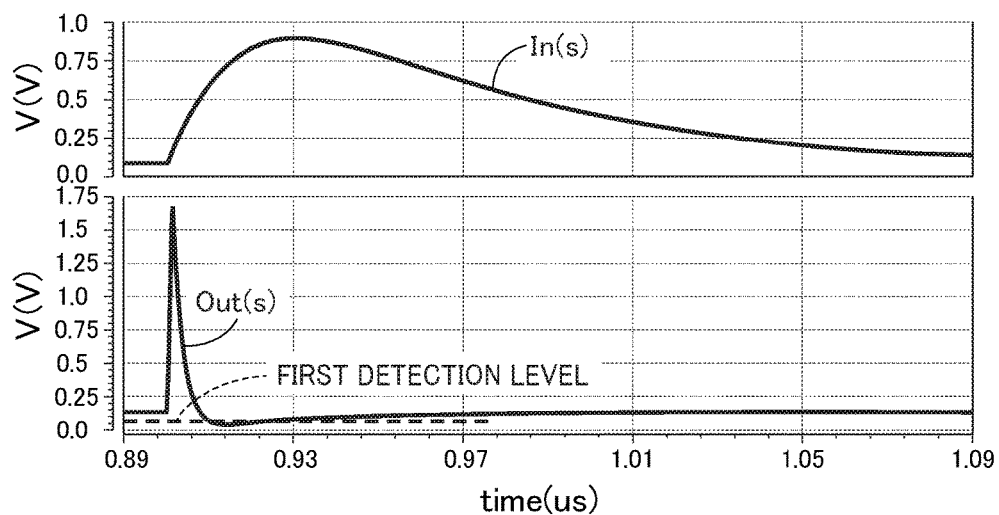
FIG. 3 is a diagram illustrating an example of an input signal and an output signal of the waveform shaping filter of FIG. 1.
Figure 4:
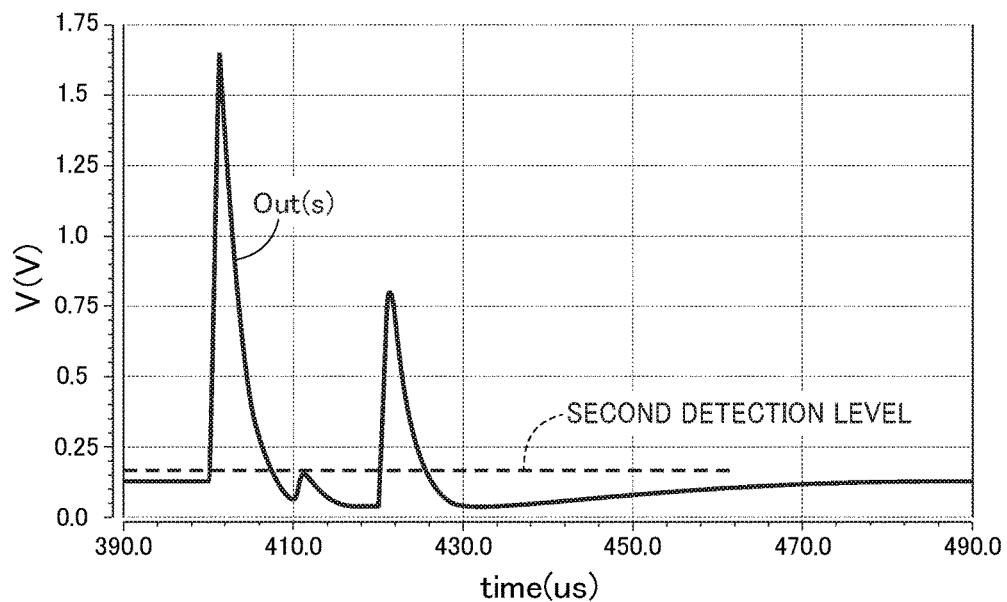
FIG. 4 is a diagram illustrating an example of an input signal and an output signal of the waveform shaping filter of FIG. 1.

If the time constant of the waveform shaping filter is larger than an appropriate time constant, the differentiation component of the input signal In(s) is too emphasized, and the undershoot occurs in the output signal Out(s), as illustrated in FIG. 3. When the neighboring input signal In(s) is input to such a waveform shaping filter, the output signal Out(s) corresponding to the input signal In(s) input during a period in which the undershoot occurs becomes small, as illustrated in FIG. 4, and the signal detection circuit may not be able to detect arrival of the input signal In(s).

Figure 5:
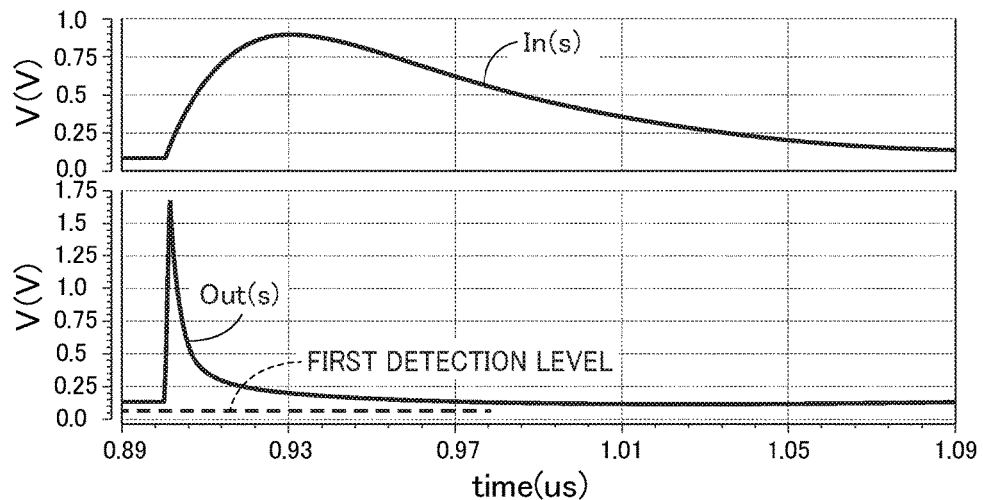
FIG. 5 is a diagram illustrating an example of an input signal and an output signal of the waveform shaping filter of FIG. 1.
Figure 6:
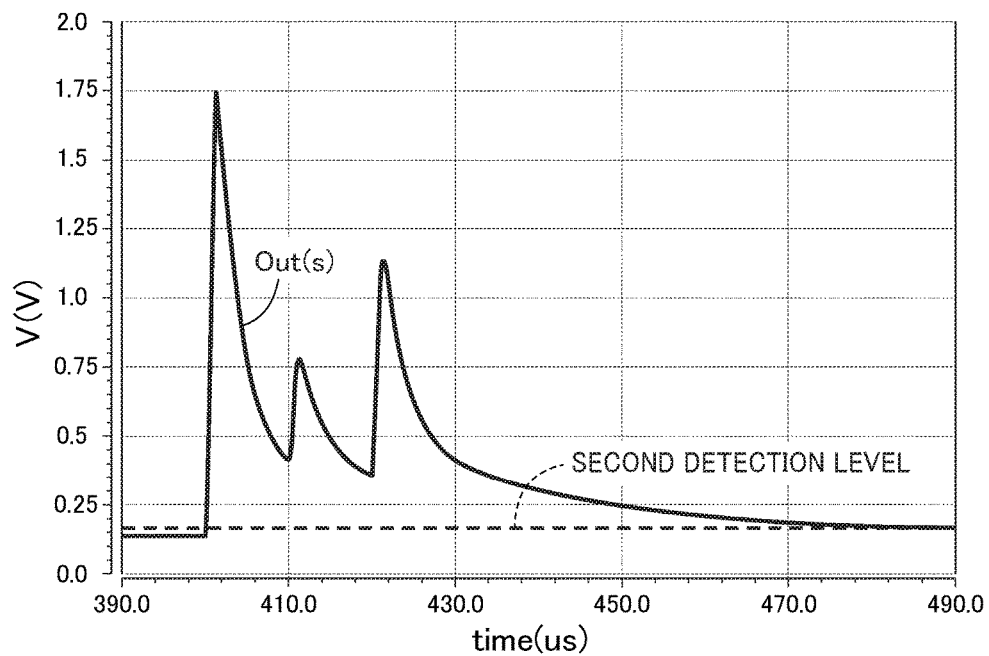
FIG. 6 is a diagram illustrating an example of an input signal and an output signal of the waveform shaping filter of FIG. 1.

Further, if the time constant of the waveform shaping filter is smaller than an appropriate time constant, the differentiation component of the input signal In(s) is not sufficiently emphasized, and the pulse width of the output signal Out(s) cannot be sufficiently narrowed, as illustrated in FIG. 5. When the neighboring input signal In(s) is input to such a waveform shaping filter, the output signal Out(s) is piled up, as illustrated in FIG. 6, and the signal detection circuit may not be able to detect arrival of the input signal In(s).

Therefore, the control circuit 3 controls the time constant of the waveform shaping filter so that the frequencies of the pole and the zero accord with each other, and the pole-zero cancellation can be properly performed. To be specific, the control circuit 3 decreases the time constant of the waveform shaping filter when the undershoot of the output signal Out(s) has been detected, and increases the time constant of the waveform shaping filter when the undershoot is not detected.

With such an adjustment method, the time constant of the waveform shaping filter can be brought close to an appropriate time constant. Therefore, the undershoot of the output signal Out(s) can be suppressed while the pulse width of the input signal In(s) is narrowed. The signal detection circuit of the subsequent stage can accurately detect the arrival of the input signal In(s), by using the output signal Out(s).

Further, the control circuit 3 detects the undershoot, using a simple circuit that compares the output signal Out(s) and the first detection level. Therefore, a sampling circuit, a control circuit that generates a sampling pulse, an AD converter, and the like are unnecessary. Therefore, the circuit scale of the waveform shaping filter can be decreased.

Figure 7:
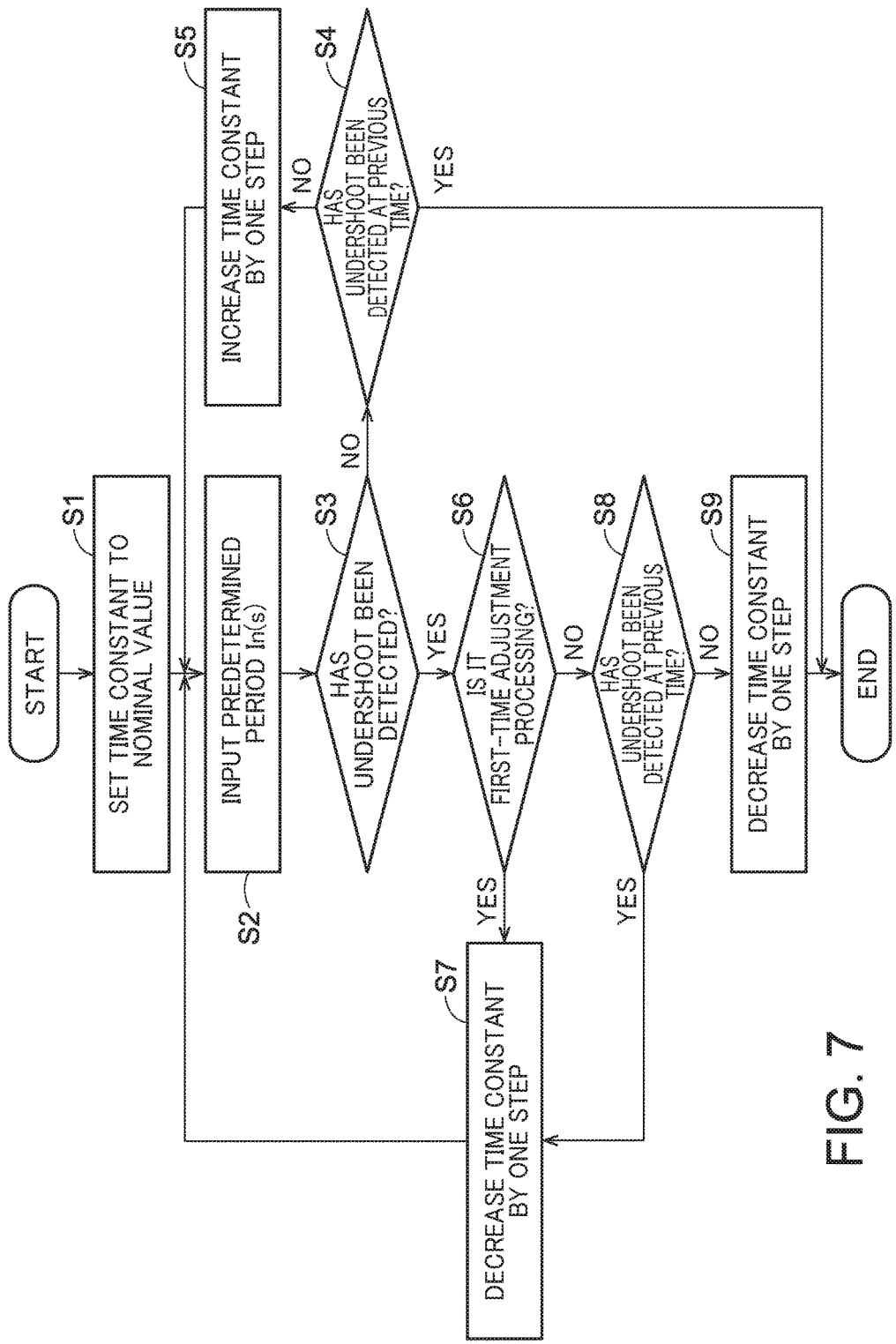
FIG. 7 is a flowchart illustrating processing of adjusting a time constant with the waveform shaping filter of FIG. 1.

Next, processing of adjusting the time constant of the waveform shaping filter will be specifically described with reference to FIGS. 7 to 12. FIG. 7 is a flowchart illustrating an example of processing of adjusting a time constant. In the adjustment processing of FIG. 7, the adjustment processing is repeatedly executed until a predetermined termination condition is satisfied.

First, in step S1, the control circuit 3 sets the time constant of the waveform shaping filter to an initial value. The initial value can be arbitrarily set, and is a nominal value, for example.

Next, in step S2, the input signal In(s) is input to the waveform shaping filter for a predetermined period. During the predetermined period, a plurality of the input signals In(s) is input, and the output signals Out(s) according to the respective input signals In(s) are output. The comparison circuit 31 compares each of the output signals Out(s) with the first detection level, and inputs comparison results to the control signal generation circuit 32.

After the elapse of the predetermined period, in step S3, the control signal generation circuit 32 determines whether the comparison circuit 31 has detected the undershoot during the predetermined period.

When the comparison circuit 31 has not detected the undershoot, that is, when the undershoot has not occurred in all of the output signals Out(s) output during the predetermined period (NO in step S3), the processing proceeds to step S4.

In step S4, the control signal generation circuit 32 determines whether the comparison circuit 31 has detected the undershoot in the adjustment processing of previous time. When the comparison circuit 31 has detected the undershoot at the previous time undershoot (YES in step S4), the processing is terminated. Meanwhile, when the comparison circuit 31 has not detected the undershoot at the previous time (NO in step S4), the processing proceeds to step S5. The comparison circuit 31 having not detected the undershoot at the previous time includes first-time adjustment processing.

In step S5, the control signal generation circuit 32 increases the time constant of the waveform shaping filter by one step, according to the control signal. Following that, the processing proceeds to step S2, and the input signal In(s) is input to the waveform shaping filter again.

Meanwhile, in step S3, when the comparison circuit 31 has detected the undershoot, that is, when the undershoot has occurred in at least one of the output signals Out(s) output during the predetermined period (YES in step S3), the processing proceeds to step S6.

In step S6, the control signal generation circuit 32 determines whether the adjustment processing of this time is the first adjustment processing. When the adjustment processing is the first adjustment processing (YES in step S6), the processing proceeds to step S7.

In step S7, the control signal generation circuit 32 decreases the time constant of the waveform shaping filter by one step, according to the control signal. Following that, the processing proceeds to step S2, and the input signal In(s) is input to the waveform shaping filter again.

Meanwhile, in step S6, when the adjustment processing of this time is not the first adjustment processing (NO in step S6), the processing proceeds to step S8.

In step S8, the control signal generation circuit 32 determines whether the comparison circuit 31 has detected the undershoot in the adjustment processing of the previous time. When the comparison circuit 31 has detected the undershoot at the previous time (YES in step S8), the processing proceeds to step S7. Meanwhile, when the comparison circuit 31 has not detected the undershoot at the previous time (NO in step S8), the processing proceeds to step S9.

In step S9, the control signal generation circuit 32 decreases the time constant of the waveform shaping filter by one step, according to the control signal. After that, the processing is terminated.

Figure 8:
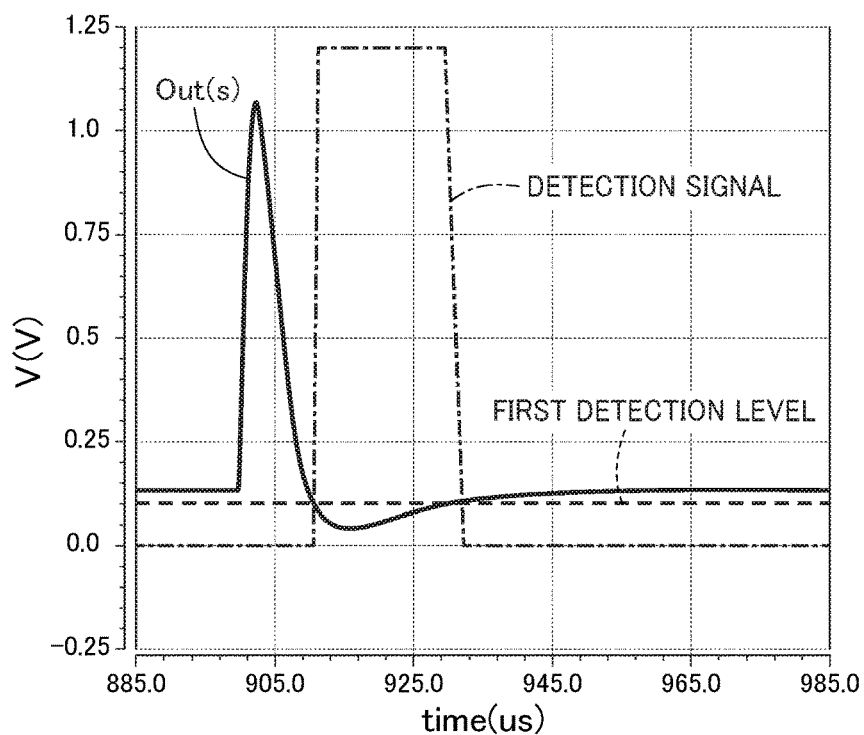
FIG. 8 is a diagram illustrating an example of an output signal of the waveform shaping filter.

FIG. 8 is a diagram illustrating an example of the output signal Out(s) of when the time constant of the waveform shaping filter is larger than an appropriate time constant $T_o$ (the time constant with which the frequencies of the pole and the zero accord with each other). When the above-described adjustment processing is executed for the waveform shaping filter, the comparison circuit 31 detects the undershoot, and outputs the detection signal, as illustrated in FIG. 8 (YES in step S3). Then, the control signal generation circuit 32 that has received the detection signal increases the time constant of the waveform shaping filter by one step (step S7).

Figure 9:
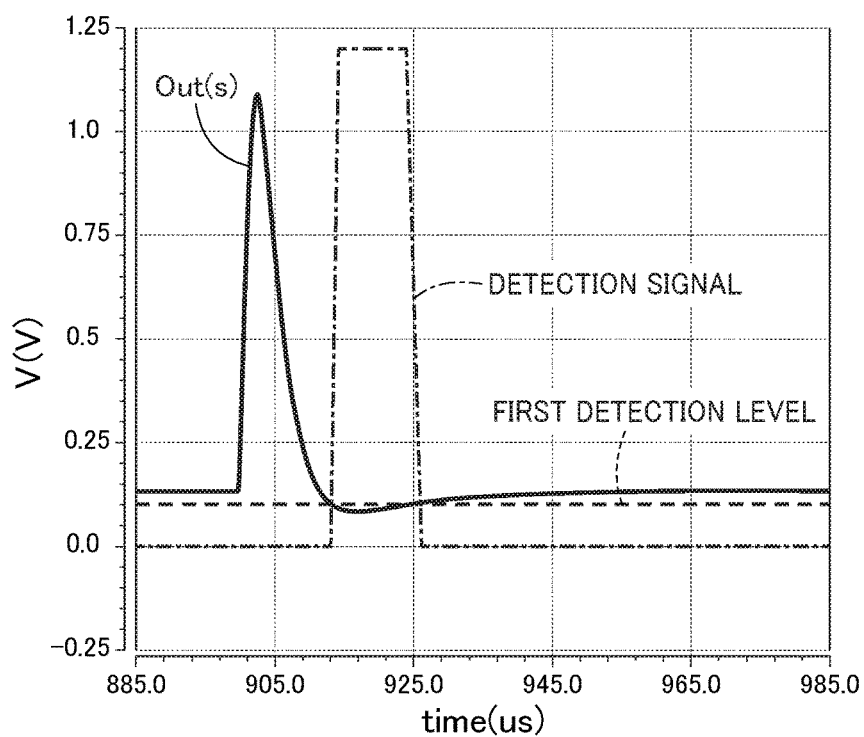
FIG. 9 is a diagram illustrating an example of an output signal of the waveform shaping filter.

FIG. 9 is a diagram illustrating the output signal Out(s) after the first-time adjustment processing is executed for the waveform shaping filter of FIG. 8. Because the time constant becomes small, it can be understood that the undershoot of the output signal Out(s) is suppressed. However, the undershoot has occurred in the output signal Out(s). Therefore, the time constant of the waveform shaping filter is decreased by one step again in the second processing (step S7). Hereinafter, the above-described processing is repeated until the undershoot of the output signal Out(s) becomes undetectable.

Figure 10:
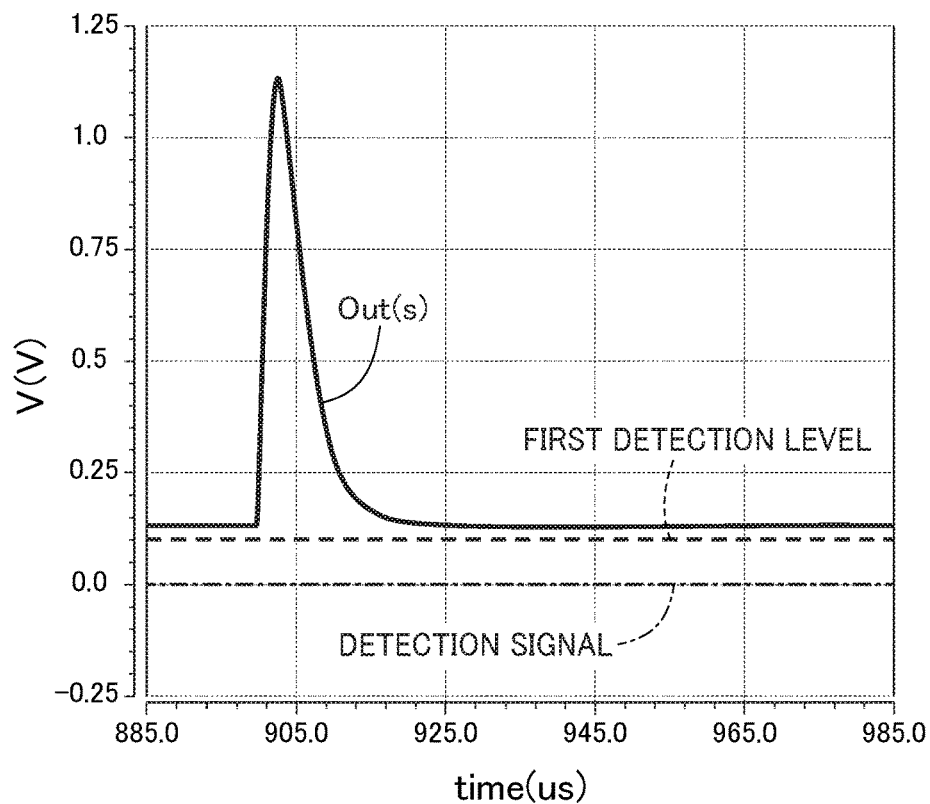
FIG. 10 is a diagram illustrating an example of an output signal of the waveform shaping filter.

FIG. 10 is a diagram illustrating the output signal Out(s) at the time of termination of the adjustment processing. As illustrated in FIG. 10, the output signal Out(s) of the waveform shaping filter becomes a signal without the undershoot exceeding the first detection level and with a narrowed pulse width, by the adjustment processing.

Figure 11:
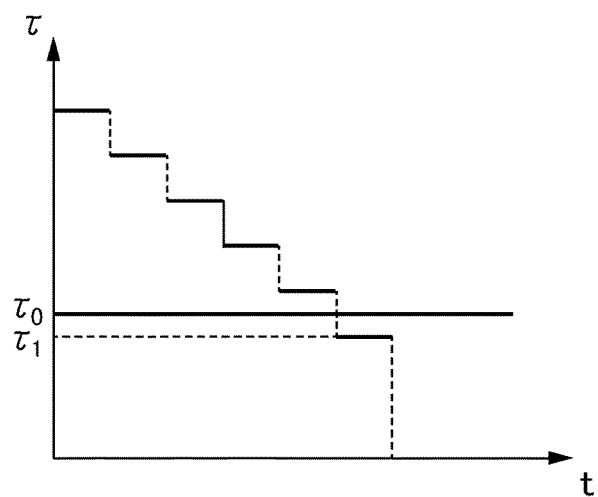
FIG. 11 is a diagram illustrating change of a time constant by the adjustment processing of FIG. 7.

This is because, as illustrated in FIG. 11, the time constant of the waveform shaping filter, which is larger than the time constant $T_0$, is decreased by one step at a time in step S7, and is finally set to the time constant $T_1$ closest to the time constant $T_0$, by the adjustment processing.

Figure 12:
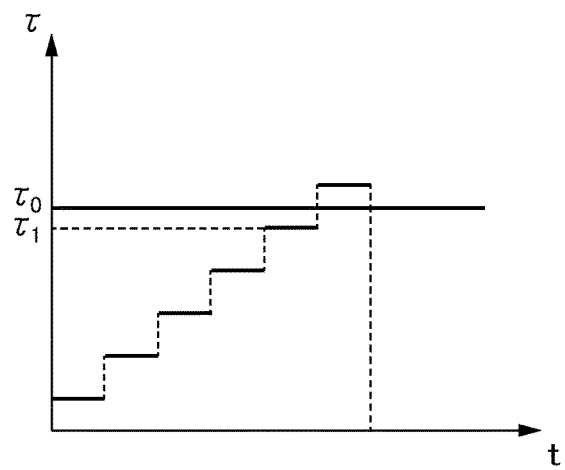
FIG. 12 is a diagram illustrating change of a time constant by the adjustment processing of FIG. 7.

The same applies to a case where the time constant of the waveform shaping filter is smaller than the time constant $T_0$. As illustrated in FIG. 12, the time constant of the waveform shaping filter is increased by one step at a time in step S5, by the adjustment processing, and when the undershoot has been detected (NO in step S8), the time constant is decreased by one step in step S9. Finally, the time constant of the waveform shaping filter is set to the time constant $T_1$ closest to the time constant $T_0$. Therefore, the output signal Out(s) becomes a signal without the undershoot exceeding the first detection level and with a narrowed pulse width.

As described above, according to the adjustment processing of FIG. 7, the time constant of the waveform shaping filter is set to the time constant $T_1$ closest to the appropriate time constant $T_0$. Therefore, the output signal Out(s) of the waveform shaping filter without the undershoot exceeding the first detection level and with a narrowed pulse width can be obtained.

In the above description, the adjustment processing is terminated by satisfying the termination condition (NO in step S8 or YES in step S4). However, the number of times of termination may be set in advance. Further, the one step of the time constant can be arbitrarily set, and the time constant $T_1$ can be brought closer to the time constant $T_0$ as the one step is smaller.

(Second Embodiment)

Figure 13:
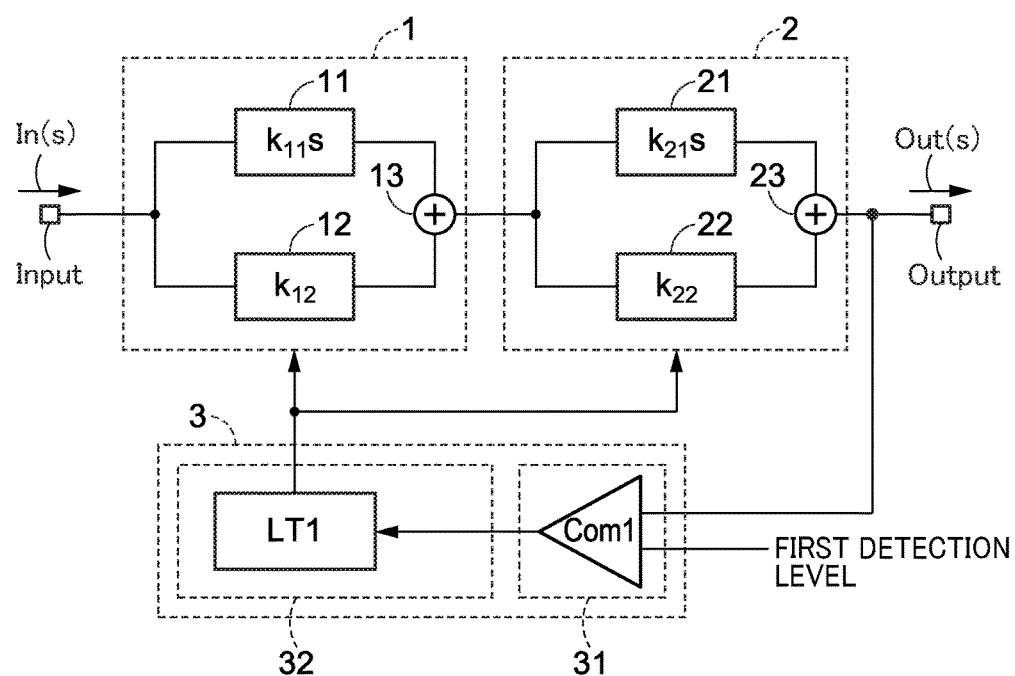
FIG. 13 is a diagram illustrating a waveform shaping filter according to a second embodiment.

A waveform shaping filter according to a second embodiment will be described with reference to FIG. 13. FIG. 13 is a diagram illustrating a waveform shaping filter according to the present embodiment. In the present embodiment, a comparison circuit 31 includes a comparator Com1. Further, a control signal generation circuit 32 includes a latch LT1. Other configurations are similar to those of FIG. 1.

The comparator Com1 (first comparator) receives an output signal Out(s) from a first input terminal, and receives a first detection level from a second input terminal. The comparator Com1 outputs a signal of 1 or 0 according to a comparison result. Hereinafter, the comparator Com1 outputs 1 when the output signal Out(s) is smaller than the first detection level (when an undershoot has been detected), and outputs 0 when the output signal Out(s) is larger than the first detection level (when the undershoot has not been detected). In this case, 1 output by the comparator Com1 becomes a detection signal illustrated in FIGS. 8 and 9. The output signal of the comparator Com1 is input to the control signal generation circuit 32.

The latch LT1 (first holding circuit) holds a detection result input from the comparator Com1. The control signal generation circuit 32 generates a control signal, based on the detection result held in the latch LT1.

With such a configuration, the undershoot can be detected without using a sampling circuit and the like. Therefore, a circuit scale of the waveform shaping filter can be made small.

Further, the latch LT1 holds the detection result. Therefore, adjustment processing like FIG. 7 becomes possible. When the adjustment processing of FIG. 7 is performed, the latch LT1 may just be reset every time the adjustment processing is executed once.

(Third Embodiment)

Figure 14:
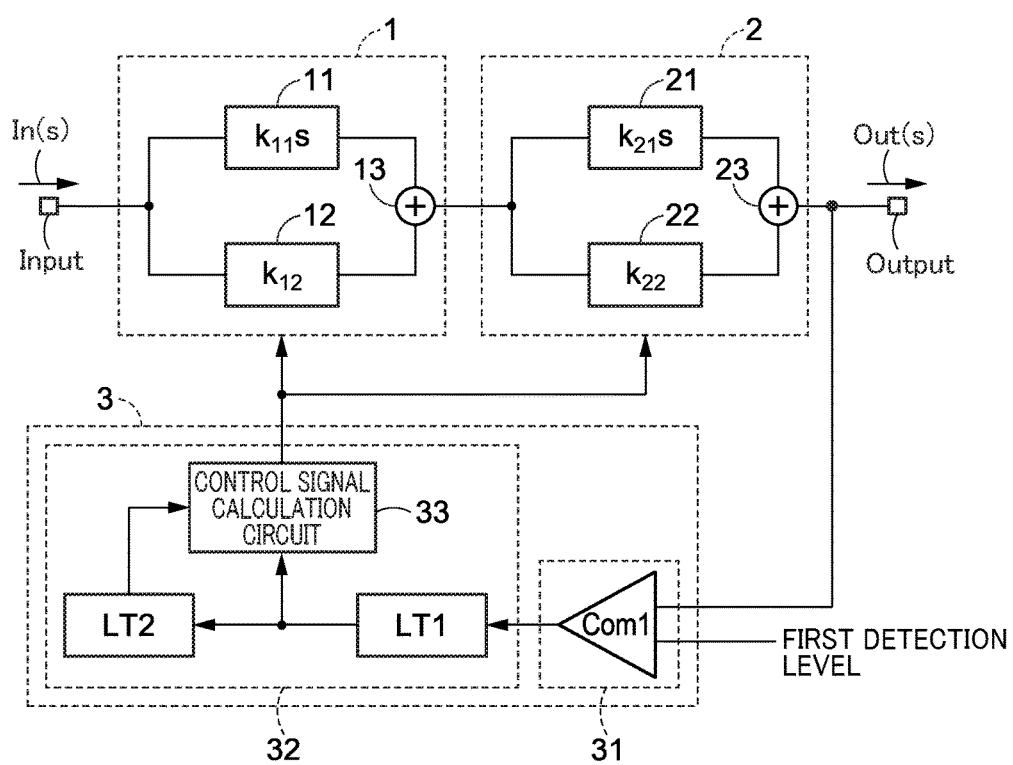
FIG. 14 is a diagram illustrating a waveform shaping filter according to a third embodiment.

Next, a waveform shaping filter according to a third embodiment will be described with reference to FIGS. 14 to 17. FIG. 14 is a diagram illustrating a waveform shaping filter according to the present embodiment. In the present embodiment, a control signal generation circuit 32 includes a latch LT2 and a control signal calculation circuit 33. Other configurations are similar to those of FIG. 13.

The latch LT2 (second holding circuit) receives a detection result held by a latch LT1, and holds a detection result in previous-time adjustment processing. That is, in the present embodiment, the detection result of this time in the adjustment processing of FIG. 7 is held in the latch LT1, and the detection result of previous time of the adjustment processing of FIG. 7 is held in the latch LT2.

The control signal calculation circuit 33 receives the detection result of this time from the latch LT1, and receives the detection result of the previous time from the latch LT2. The control signal calculation circuit 33 generates a control signal, based on the two input detection results.

To be specific, the control signal calculation circuit 33 generates the control signal for decreasing a time constant when an undershoot has been detected at the previous time, and at this time.

Further, the control signal calculation circuit 33 generates the control signal for increasing the time constant when the undershoot has not been detected at the previous time, and at this time. Further, the control signal calculation circuit 33 generates the control signal for decreasing the time constant, and generates an adjustment termination signal for terminating the adjustment processing when the undershoot has not been detected at the previous time, and when the undershoot has been detected at this time. Then, the control signal calculation circuit 33 generates the adjustment termination signal when the undershoot has been detected at the previous time, and when the undershoot has not been detected at this time.

The time constant of the waveform shaping filter is controlled according to the control signal generated by the control signal calculation circuit 33, and the adjustment processing of FIG. 7 is realized.

Figure 15:
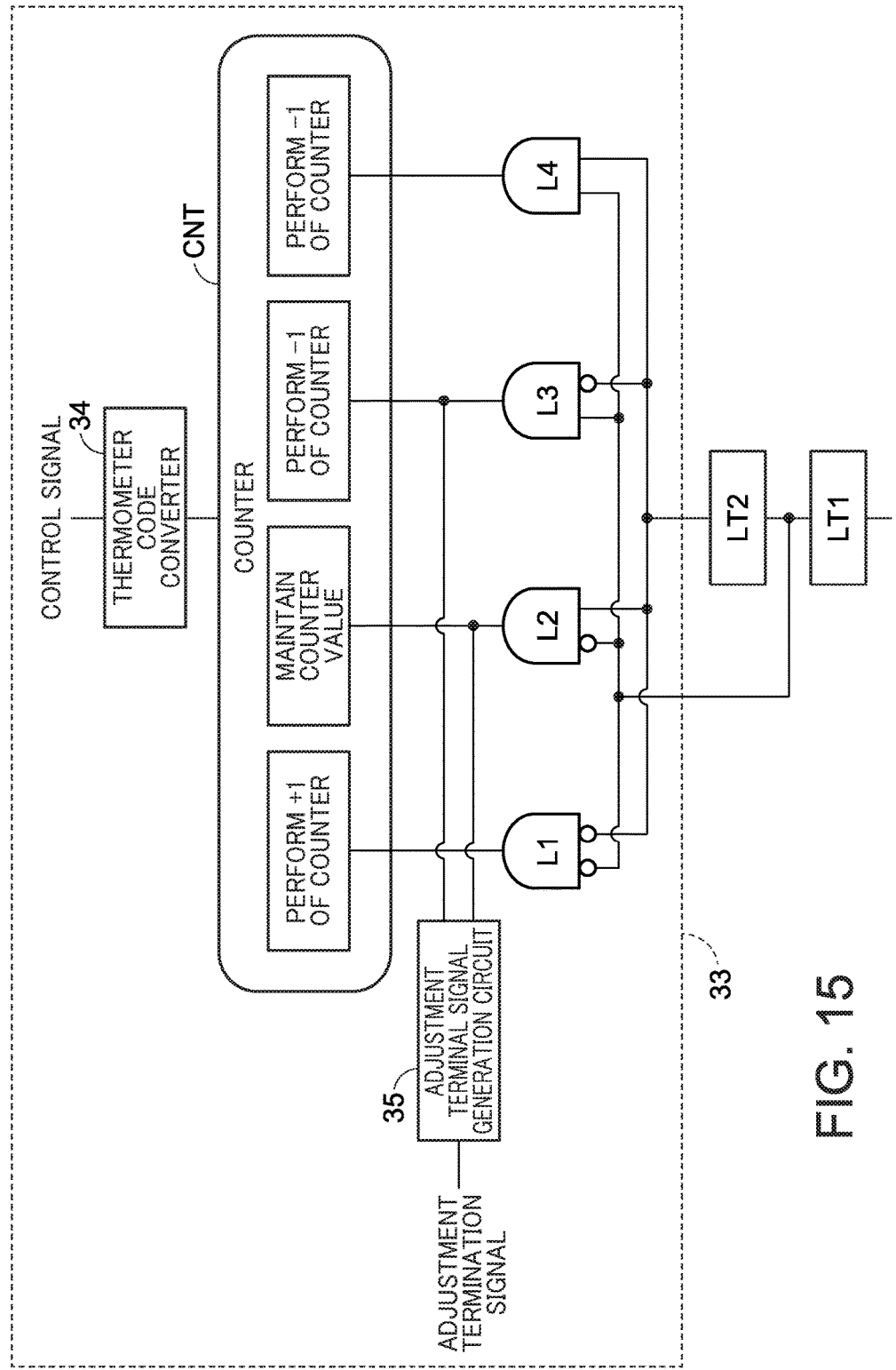
FIG. 15 is a diagram illustrating an example of a control signal calculation circuit of FIG. 14.

FIG. 15 is a diagram illustrating an example of the control signal calculation circuit 33. As illustrated in FIG. 15, the control signal calculation circuit 33 includes logic circuits L1 to L4, a counter CNT, a thermometer code converter 34, and an adjustment termination signal generation circuit 35. Hereinafter, the latch LT1 outputs 1 when the undershoot has been detected at this time, and outputs 0 when the undershoot has not been detected at this time. Further, the latch LT2 outputs 1 when the undershoot has been detected at the previous time, and outputs 0 when the undershoot has not been detected at the previous time.

The logic circuits L1 to L4 receive the output signals of the latches LT1 and LT2. The logic circuits L1 to L4 are configured from a NAND circuit and an inverter circuit, for example.

The logic circuit L1 outputs 1 when having been input 0 from the latch LT1 and having been input 0 from the latch LT2, and outputs 0 in other cases. That is, when the undershoot has not been detected at this time and at the previous time, the logic circuit L1 outputs 1.

The logic circuit L2 outputs 1 when having been input 0 from the latch LT1 and having been input 1 from the latch LT2, and outputs 0 in other cases. That is, the logic circuit L2 outputs 1 when the undershoot has not been detected at this time, and the undershoot has been detected at the previous time.

The logic circuit L3 outputs 1 when having been input 1 from the latch LT1 and having been input 0 from the latch LT2, and outputs 0 in other cases. That is, the logic circuit L3 outputs 1 when the undershoot has been detected at this time, and the undershoot has not been detected at the previous time.

The logic circuit L4 outputs 1 when having been input 1 from the latch LT1 and having been input 1 from the latch LT2, and outputs 0 in other cases. That is, the logic circuit L4 outputs 1 when the undershoot has been detected at this time and at the previous time.

The counter CNT holds a count value according to the time constant set to the waveform shaping filter. The counter CNT receives output signals of the logic circuits L1 to L4. The count value of the counter CNT is controlled according to the output signals of the logic circuits L1 to L4.

To be specific, the count value is increased by 1 when 1 is input from the logic circuit L1. Accordingly, the time constant of the waveform shaping filter is increased by one step (step S5). Further, the count value is unchanged when 1 is input from the logic circuit L2. Further, the count value is decreased by 1 when 1 is input from the logic circuit L3. Accordingly, the time constant of the waveform shaping filter is decreased by one step (step S9). Further, the count value is decreased by 1 when 1 is input from the logic circuit L4. Accordingly, the time constant of the waveform shaping filter is decreased by one step (step S7).

The thermometer code converter 34 converts the count value of the counter CNT into a thermometer code. The count value converted into the thermometer code becomes a control signal. The control signal is input to filter stages 1 and 2. Accordingly, the time constant of the waveform shaping filter is controlled.

The adjustment termination signal generation circuit 35 generates the adjustment termination signal when having been input the output signals of the logic circuits L2 and L3, and having been input 1 from the logic circuit L2 or the logic circuit L3. That is, the adjustment termination signal generation circuit 35 generates the adjustment termination signal when a termination condition (NO in step S8 or YES in step S4) is satisfied. The adjustment termination signal generated by the adjustment termination signal generation circuit 35 is input to an external device (a device that mounts the waveform shaping filter) that controls the adjustment processing, and terminates the adjustment processing of FIG. 7. The adjustment termination signal generation circuit 35 is configured from, for example, an OR circuit.

Figure 16:
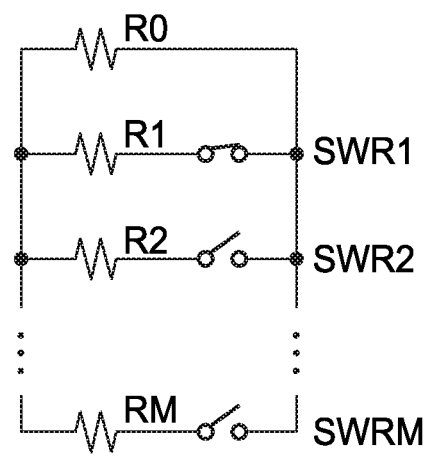
FIG. 16 is a diagram illustrating an example of a time constant adjustment circuit included in a filter stage.

FIG. 16 is a diagram illustrating an example of a time constant adjustment circuit included in the filter stages 1 and 2. The time constant adjustment circuit of FIG. 16 includes (M+1) resistors R0 to RM connected in parallel, and M switches SWR1 to SWRM that respectively connect or release the resistors R1 to RM. Since the time constant depends on a resistance value, the control circuit 3 can adjust the time constant of the filter stages 1 and 2 by adjusting opening/closing of the switches SWR1 to SWRM according to the control signal. For example, when the filter stages 1 and 2 are RC circuits, the control circuit 3 can increase (decrease) the time constant of the waveform shaping filter by increasing (decreasing) the resistance value of the time constant adjustment circuit.

Figure 17:
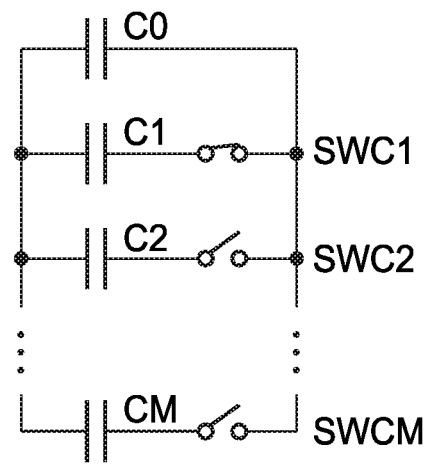
FIG. 17 is a diagram illustrating an example of a time constant adjustment circuit included in a filter stage.

FIG. 17 is a diagram illustrating another example of the time constant adjustment circuit included in the filter stages 1 and 2. The time constant adjustment circuit of FIG. 17 includes (M+1) capacitors C0 to CM connected in parallel, and M switches SWC1 to SWCM that respectively connect or release the capacitors C1 to CM. Since the time constant depends on a capacitance value, the control circuit 3 can adjust the time constant of the filter stages 1 and 2 by controlling opening/closing of the switches SWC1 to SWCM according to the control signal. For example, when the filter stages 1 and 2 are RC circuits, the control circuit 3 can increase (decrease) the time constant of the waveform shaping filter by increasing (decreasing) the capacitance value of the time constant adjustment circuit.

With such a configuration, the undershoot can be detected without using a sampling circuit and the like. Therefore, a circuit scale of the waveform shaping filter can be made small.

Further, the latches LT1 and LT2 hold the detection result. Therefore, adjustment processing like FIG. 7 becomes possible. When the adjustment processing of FIG. 7 is performed, the latch LT1 may just be reset every time the adjustment processing is executed once.

(Fourth Embodiment)

Figure 18:
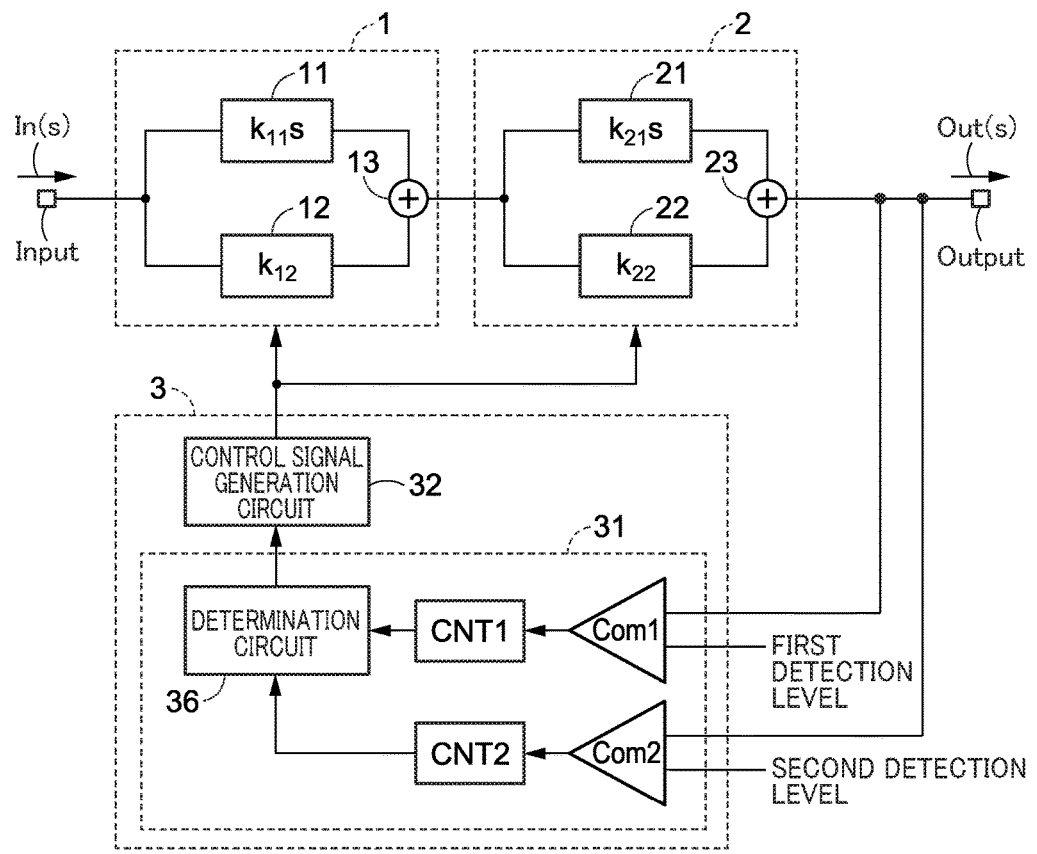
FIG. 18 is a diagram illustrating a waveform shaping filter according to a fourth embodiment.

Next, a waveform shaping filter according to a fourth embodiment will be described with reference to FIG. 18. FIG. 18 is a diagram illustrating a waveform shaping filter according to the present embodiment. In the present embodiment, a comparison circuit 31 includes a counter CNT1, a second comparator Com2, a counter CNT2, and a determination circuit 36. Other configurations are similar to those of FIG. 1.

The counter CNT1 (first counter) counts the number of times the first comparator Com1 has detected an undershoot. A count value cnt1 of the counter CNT1 is reset every time adjustment processing is performed once. That is, the counter CNT1 counts the number of times of the undershoot detected in the one-time adjustment processing. The count value cnt1 of the counter CNT1 is input to the determination circuit 36.

The second comparator Com2 receives an output signal Out(s) from an first input terminal, and receives a second detection level from a second input terminal. As described above, the second detection level is a threshold for detecting arrival of an input signal In(s). The second comparator Com2 outputs a signal of 1 or 0 according to a comparison result. Hereinafter, the second comparator Com2 outputs 1 when the output signal Out(s) is larger than the second detection level (when arrival of the input signal In(s) has been detected), and outputs 0 when the output signal Out(s) is smaller than the second detection level (when arrival of the input signal In(s) has not been detected). An output signal of the second comparator Com2 is input to the counter CNT2.

The counter CNT2 (second counter) counts the number of times the arrival of the input signal In(s) has been detected by the second comparator Com2. A count value cnt2 of the counter CNT2 is reset every time adjustment processing is performed once. That is, the counter CNT2 counts the number of times of the input signals In(s) input during one-time adjustment processing. The count value cnt2 of the counter CNT2 is input to the determination circuit 36.

The determination circuit 36 receives a count value cnt1 of the counter CNT1 and the count value cnt2 of the counter CNT2. The determination circuit 36 calculates a ratio (cnt1/cnt2) of the count value cnt1 and the count value cnt2, and compares the ratio with a predetermined threshold. The determination circuit 36 outputs a signal of 1 or 0 according to a comparison result. Hereinafter, the determination circuit 36 outputs 1 when the cnt1/cnt2 is larger than the threshold, and outputs 0 when the cnt1/cnt2 is smaller than the threshold. In the present embodiment, 1 output by the determination circuit 36 becomes a detection signal illustrated in FIGS. 8 and 9. The output signal of the determination circuit 36 is input to the control signal generation circuit 32.

In the above-described embodiments, when the undershoot is detected even once during a predetermined period of step S2, it is determined that a time constant is large, and the time constant is set to be decreased by one step by a control circuit 3. In this adjustment processing, the time constant is adjusted so that the undershoot does not reliably occur in the output signal Out(s). Accordingly, the input signal In(s) can be prevented from being not detected due to the undershoot of the output signal Out(s).

However, when the time constant is adjusted so that the undershoot does not reliably occur, a pulse width of the output signal Out(s) cannot be sufficiently narrowed, and as a result, detection accuracy of the input signal In(s) may be decreased (see FIG. 6).

Therefore, in the present embodiment, when the cnt1/cnt2 is smaller than the threshold, the undershoot is considered undetected, and the time constant is controlled. Accordingly, the undershoot slightly occurs in the output signal Out(s) after adjustment of the time constant. The undershoot of the output signal Out(s) is allowed in this way, so that the pulse width of the output signal Out(s) is narrowed, and the detection accuracy of the input signal In(s) can be improved.

Note that the above threshold can be arbitrarily set to 1/10 or 1/100. The undershoot is further suppressed as the threshold is made smaller, and the pulse width is made narrower as the threshold is made larger. The threshold may just be set according to the detection accuracy of the required input signal In(s) or characteristics of the input signal In(s).

(Fifth Embodiment)

Figure 19:
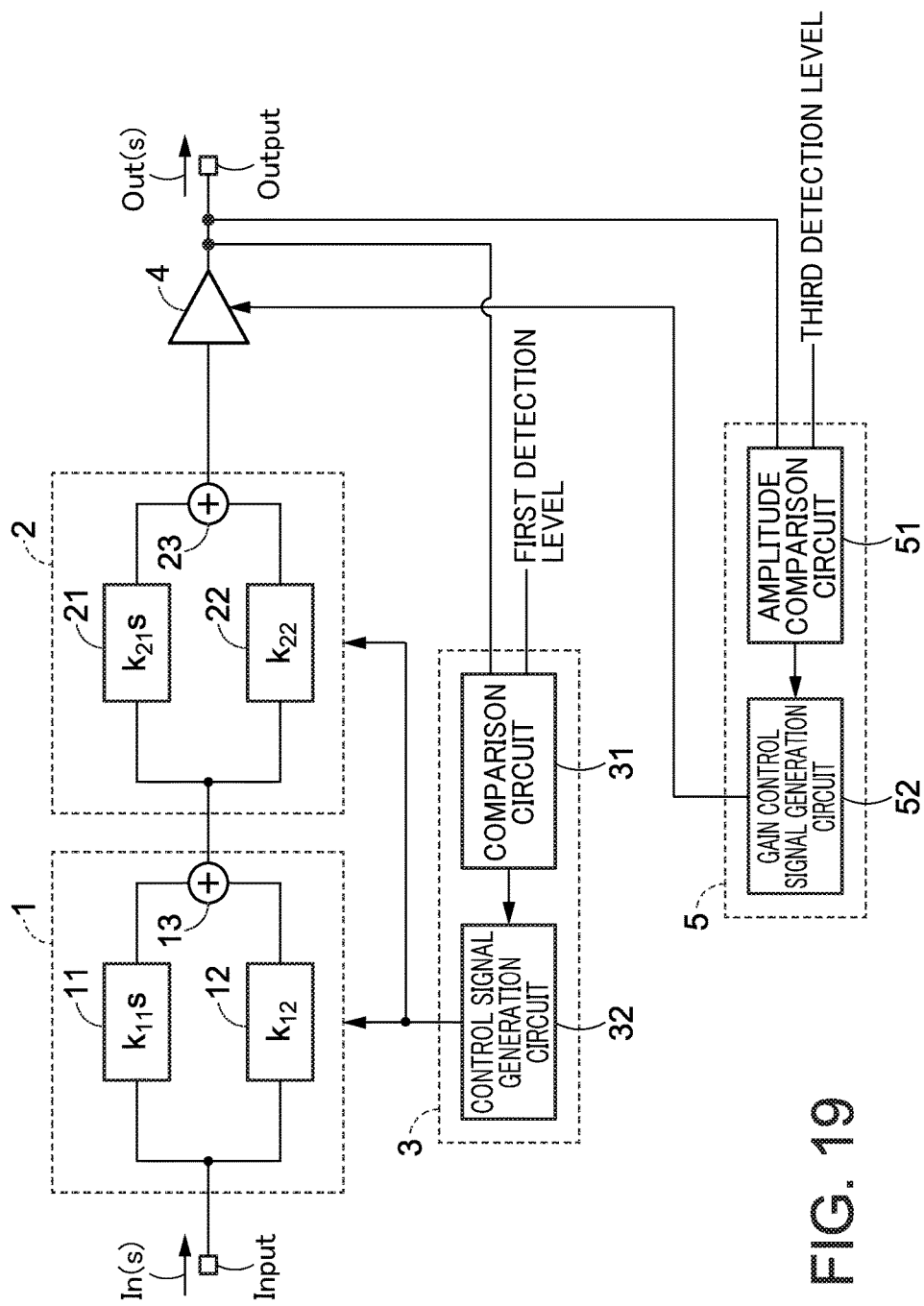
FIG. 19 is a diagram illustrating a waveform shaping filter according to a fifth embodiment.

Next, a waveform shaping filter according to a fifth embodiment will be described with reference to FIGS. 19 to 24. FIG. 19 is a diagram illustrating a waveform shaping filter according to the present embodiment. In the present embodiment, the waveform shaping filter includes an amplifier circuit 4 and a gain control circuit 5. Other configurations are similar to those of FIG. 1.

The amplifier circuit 4 is connected between an adder circuit 23 and an output terminal Output, and amplifies an output signal of a filter stage 2. In the example of FIG. 19, an output signal of the amplifier circuit 4 becomes an output signal Out(s) of the waveform shaping filter.

The gain control circuit 5 controls a gain of the amplifier circuit 4, based on the output signal Out(s). As illustrated in FIG. 19, the gain control circuit 5 includes an amplitude comparison circuit 51 and a gain control signal generation circuit 52.

The amplitude comparison circuit 51 receives the output signal Out(s). The comparison circuit 51 compares the output signal Out(s) and a third detection level. The third detection level is a threshold for setting amplitude of the output signal Out(s) to fall within a predetermined range. Hereinafter, a case where the third detection level is an upper limit of the amplitude will be described. However, the third detection level may be a lower limit of the amplitude. Whether the upper limit is set or the lower limit is set as the third detection level is determined according to a direction (sign) of an input signal In(s). The amplitude comparison circuit 51 inputs a comparison result between the output signal Out(s) and the third detection level, that is, a detection result of an excess of the third detection level by the output signal Out(s) to the gain control signal generation circuit 52.

The gain control signal generation circuit 52 generates a control signal for controlling the gain of the amplifier circuit 4, based on the detection result input from the amplitude comparison circuit 51, and inputs the control signal to the amplifier circuit 4. The gain control circuit 5 controls the gain of the amplifier circuit 4 according to the control signal. To be specific, the gain control signal generation circuit 52 increases the gain of the amplifier circuit 4 when the excess has not been detected (when maximum amplitude of the output signal Out(s) is smaller than the third detection level), and decrease the gain of the amplifier circuit 4 when the excess has been detected (when the maximum amplitude of the output signal Out(s) is larger than the third detection level). Accordingly, the amplitude of the output signal Out(s) can be set to fall within a range smaller than the third detection level.

Figure 20:
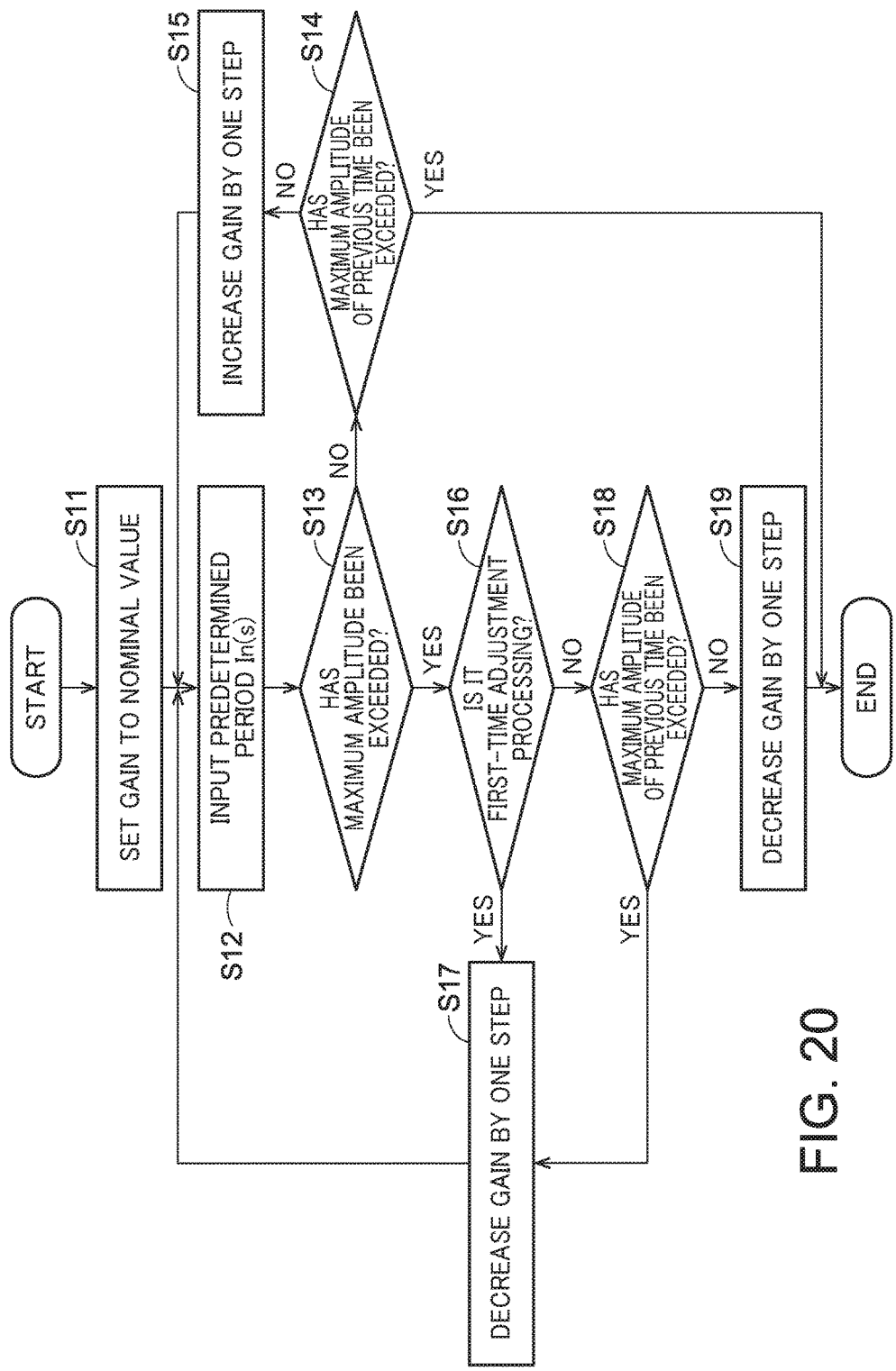
FIG. 20 is a flowchart illustrating processing of adjusting a gain with the waveform shaping filter of FIG. 19.

Next, processing of adjusting the gain of the amplifier circuit 4 will be specifically described with reference to FIGS. 20 to 24. FIG. 20 is a flowchart illustrating an example of processing of adjusting a gain. The processing of adjusting a gain is performed after termination of processing of adjusting a time constant. In the adjustment processing of FIG. 20, the adjustment processing is repeatedly executed until a predetermined termination condition is satisfied.

First, in step S11, the gain control circuit 5 sets the gain of the amplifier circuit 4 to an initial value. The initial value can be arbitrarily set, and is a nominal value, for example.

Next, in step S12, the input signal In(s) is input to the waveform shaping filter for a predetermined period. A plurality of the input signals In(s) is input during the predetermined period, and the output signals Out(s) according to the respective input signals In(s) are output. The amplitude comparison circuit 51 compares each of the output signals Out(s) with the third detection level, and inputs a comparison result (detection result) to the gain control signal generation circuit 52.

After the elapse of the predetermined period, in step S13, the gain control signal generation circuit 52 determines whether the excess has been detected during the predetermined period, that is, whether the maximum amplitude of the output signal Out(s) has exceeded the third detection level.

When the excess has not been detected, that is, when the amplitude of all of the output signals Out(s) output during the predetermined period is smaller than the third detection level (NO in step S13), the processing proceeds to step S14.

In step S14, the gain control signal generation circuit 52 determines whether the excess has been detected in the adjustment processing of previous time. When the excess has been detected in the adjustment processing of the previous time (YES in step S14), the processing is terminated. Meanwhile, when the excess has not been detected in the adjustment processing of the previous time (NO in step S14), the processing proceeds to step S15. The case where the excess has not been detected in the adjustment processing of the previous time includes first adjustment processing.

In step S15, the gain control signal generation circuit 52 increases the gain of the amplifier circuit 4 by one step, according to the control signal. After that, the processing proceeds to step S12, and the input signal In(s) is input to the waveform shaping filter again.

Meanwhile, in step S13, when the excess has been detected, that is, when the amplitude of at least one of the output signals Out(s) output during the predetermined period has exceeded the third detection level (YES in step S13), the processing proceeds to step S16.

In step S16, the gain control signal generation circuit 52 determines whether the adjustment processing of this time is the first adjustment processing. When the adjustment processing is the first adjustment processing (YES in step S16), the processing proceeds to step S17.

In step S17, the gain control signal generation circuit 52 decreases the gain of the amplifier circuit 4 by one step, according to the control signal. After that, the processing proceeds to step S12, and the input signal In(s) is input to the waveform shaping filter again.

Meanwhile, in step S16, when the adjustment processing of this time is not the first adjustment processing (NO in step S16), the processing proceeds to step S18.

In step S18, the gain control signal generation circuit 52 determines whether the excess has been detected in the adjustment processing of previous time. When the excess has been detected in the adjustment processing of previous time (YES in step S18), the processing proceeds to step S17. Meanwhile, when the excess has not been detected in the adjustment processing of previous time (NO in step S18), the processing proceeds to step S19.

In step S19, the gain control signal generation circuit 52 decreases the gain of the amplifier circuit 4 by one step, according to the control signal. Following that, the processing is terminated.

Figure 21:
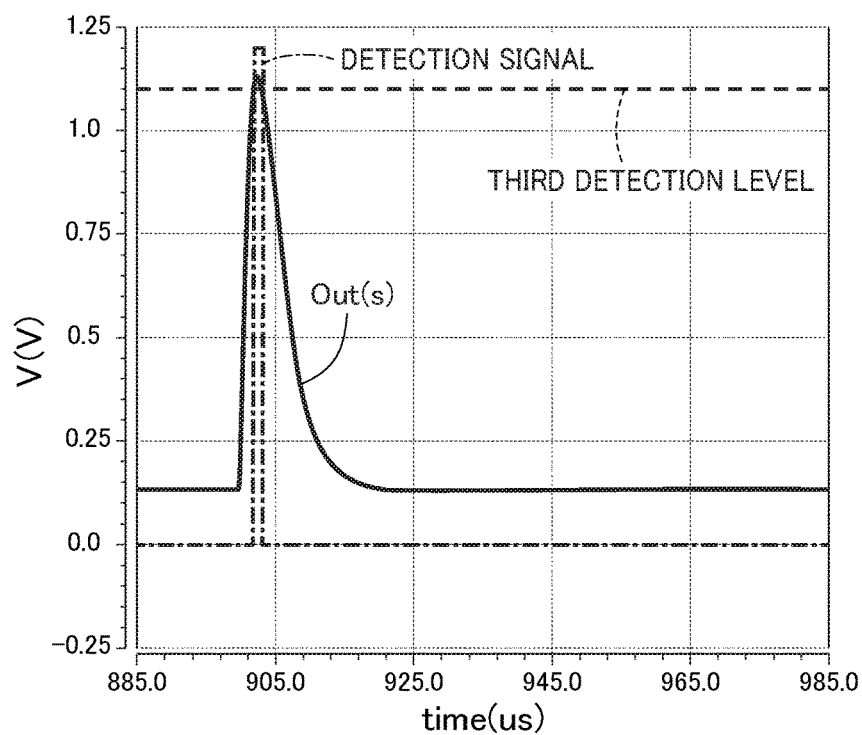
FIG. 21 is a diagram illustrating an example of an output signal of a waveform shaping filter.

FIG. 21 is a diagram illustrating an example of the output signal Out(s) of when the maximum amplitude of the output signal Out(s) is larger than the third detection level. When the above-described adjustment processing is executed for the waveform shaping filter, the amplitude comparison circuit 51 detects that the maximum amplitude of the output signal Out(s) has exceeded to the third detection level, and outputs the detection signal (YES in step S13), as illustrated in FIG. 21. Then, the gain control signal generation circuit 52 that has received the detection signal and decreases the gain of the amplifier circuit 4 by one step (step S17).

Figure 22:
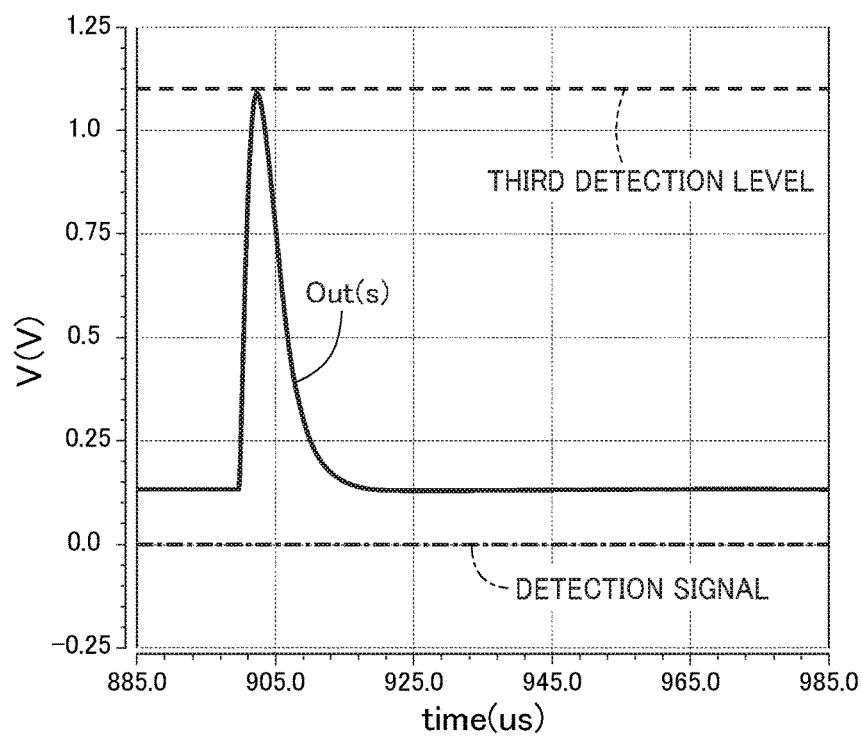
FIG. 22 is a diagram illustrating an example of an output signal of a waveform shaping filter.

FIG. 22 is a diagram illustrating the output signal Out(s) at the time of termination of the adjustment processing. As illustrated in FIG. 22, the maximum amplitude of the output signal Out(s) of the waveform shaping filter is maximized within the range smaller than the third detection level, by the adjustment processing.

This is because, when the maximum amplitude is larger than the third detection level, the gain is decreased by one step at a time in step S17, and finally, the gain is set to a gain with the maximum amplitude smaller than the third detection level and closest to the third detection level.

The same applies to a case where the maximum amplitude is smaller than the third detection level. The gain of the amplifier circuit 4 is increased by one step at a time in step S15, and the maximum amplitude becomes larger than the third detection level, by the adjustment processing (NO in step S18), the gain is decreased by one step in step S19. Finally, the gain of the amplifier circuit 4 is set to a gain with the maximum amplitude smaller than the third detection level and closest to the third detection level. Therefore, the maximum amplitude of the output signal Out(s) is maximized within the range smaller than the third detection level.

As described above, according to the adjustment processing of FIG. 22, the gain of the amplifier circuit 4 can be set such that the maximum amplitude of the output signal Out(s) can approximately accord with the third detection level. Therefore, by setting an upper limit of an input range of a circuit (an AD converter or the like) of a subsequent state of the waveform shaping filter to the third detection level, the output signal Out(s) can be adjusted to have amplitude falling within the input range of the circuit of the subsequent stage.

Note that, in the above description, the adjustment processing has been terminated by satisfying the termination condition (NO in step S18 or YES in step S14). However, the number of times of termination may be set in advance. Further, the one step of the gain can be arbitrarily set, and the maximum amplitude can be brought closer to the third detection level as the one step is made smaller.

Figure 23:
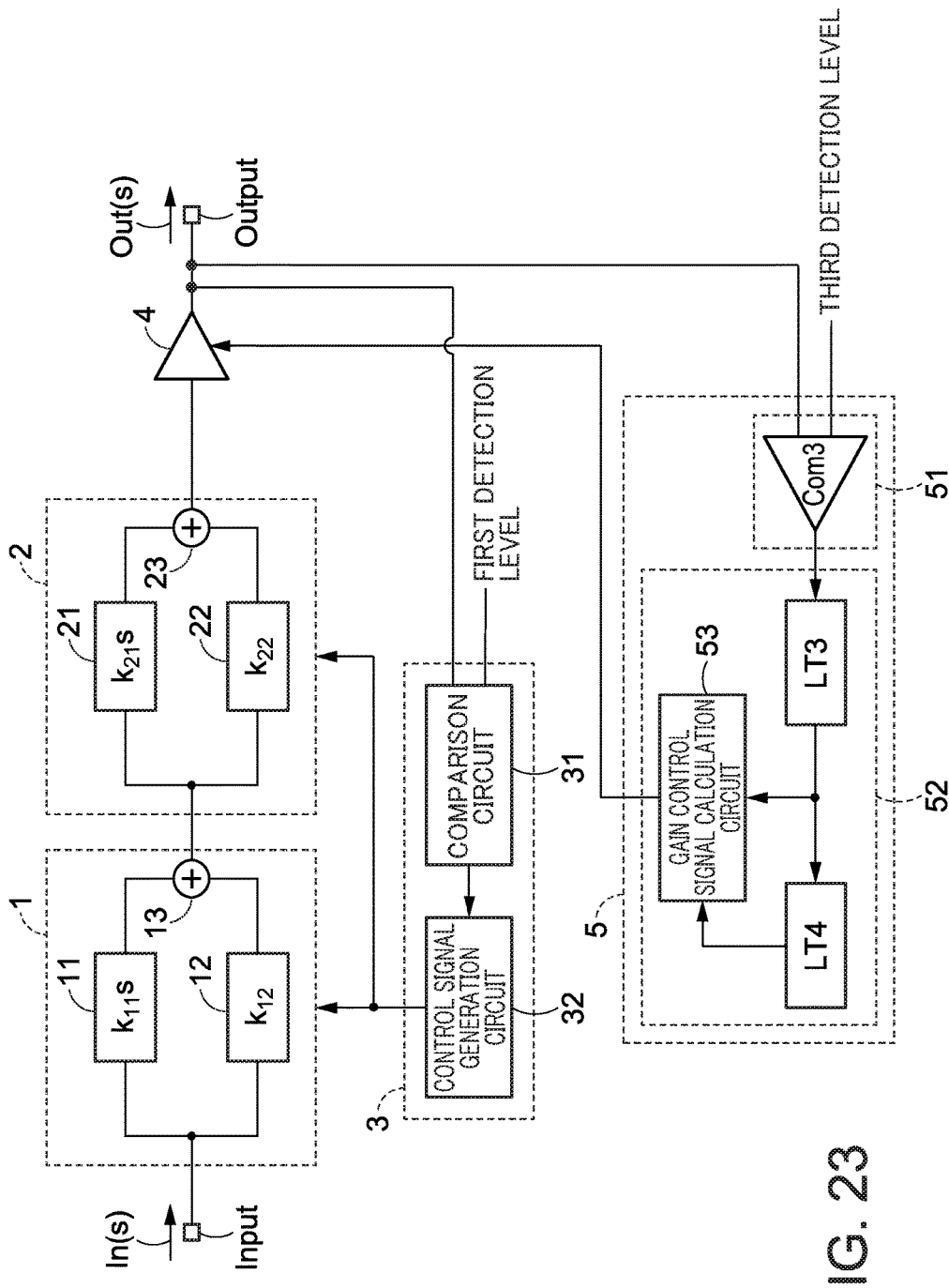
FIG. 23 is a diagram illustrating an example of a gain control circuit of FIG. 19.

Here, FIG. 23 is a diagram illustrating an example of the gain control circuit 5. In FIG. 23, the amplitude comparison circuit 51 includes a comparator Com3. Further, the gain control signal generation circuit 52 includes a latch LT3, a latch LT4, and a gain control signal calculation circuit 53. Other configurations are similar to those of FIG. 19.

The comparator Com3 (second comparator) receives the output signal Out(s) from the first input terminal, and receives the third detection level from the second input terminal. The comparator Com3 outputs a signal of 1 or 0 according to a comparison result. Hereinafter, the comparator Com3 outputs 1 when the output signal Out(s) is larger than the third detection level (the excess has been detected), and outputs 0 when the output signal Out(s) is smaller than the third detection level (the excess has not been detected). In this case, 1 output by the comparator Com3 becomes the detection signal illustrated in FIG. 21. The output signal of the comparator Com3 is input to the gain control signal generation circuit 52.

The latch LT3 (third holding circuit) receives the output signal of the comparator Com3, and holds the detection result in the adjustment processing of this time.

The latch LT4 (fourth holding circuit) receives the detection result held by the latch LT3, and holds the detection result in the previous-time adjustment processing.

The gain control signal calculation circuit 53 receives the detection result of this time from the latch LT3, and receives the detection result of previous time from the latch LT4. The gain control signal calculation circuit 53 generates a control signal, based on the two input detection results.

To be specific, the gain control signal calculation circuit 53 generates the control signal for decreasing the gain when the excess has been detected at the previous time and at this time. Further, the gain control signal calculation circuit 53 generates the control signal for increasing the gain when the excess has not been detected at the previous time and in this time. Further, the gain control signal calculation circuit 53 generates the control signal for decreasing the gain, and generates a gain adjustment termination signal for terminating the adjustment processing when the excess has not been detected at the previous time, and has been detected at this time. Then, the gain control signal calculation circuit 53 generates the gain adjustment termination signal when the excess has been detected at the previous time, and has not been detected at this time.

The gain of the amplifier circuit 4 is controlled according to the control signal generated by the gain control signal calculation circuit 53, and the adjustment processing of FIG. 20 is realized.

Figure 24:
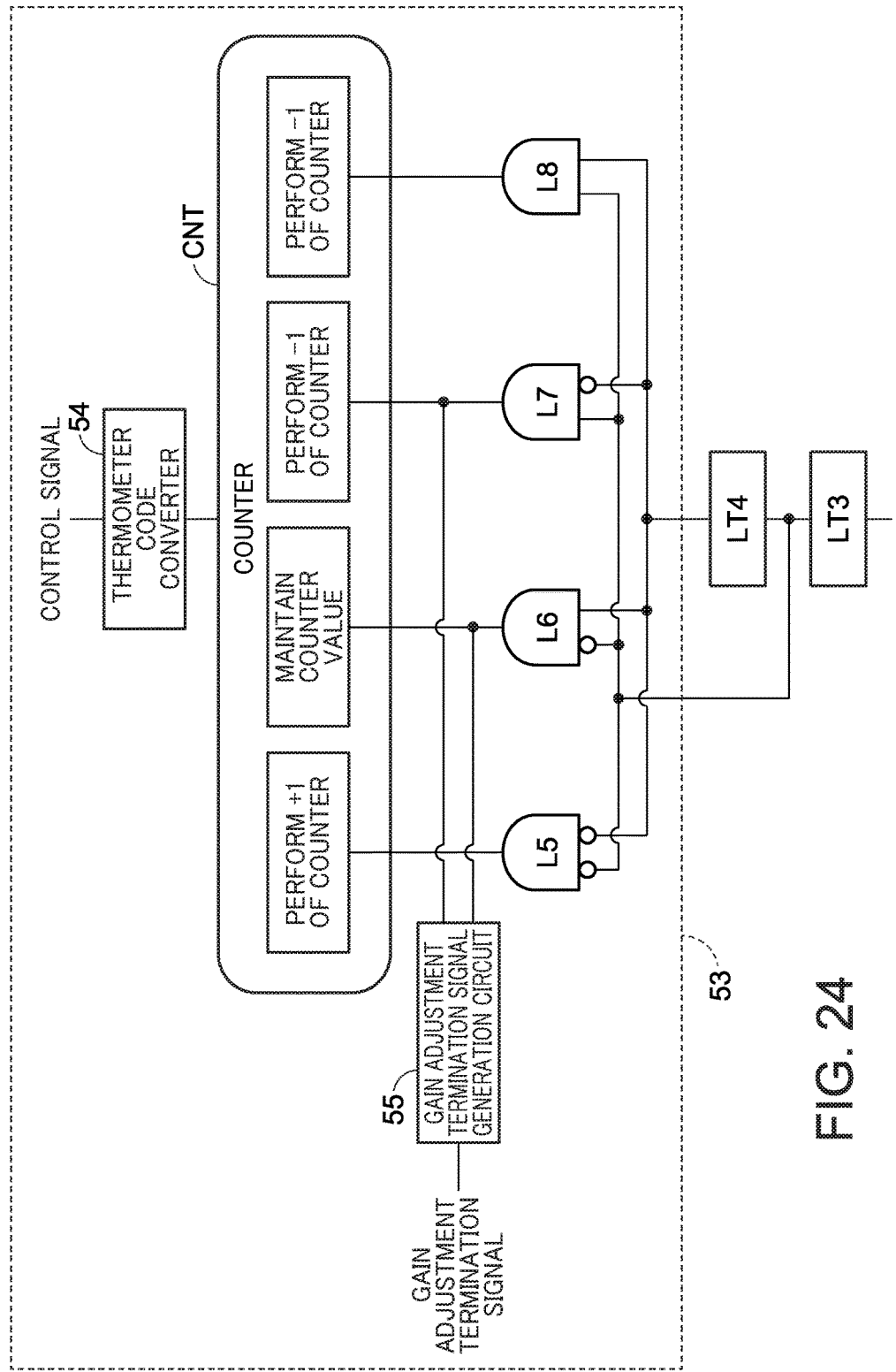
FIG. 24 is a diagram illustrating an example of a gain control signal calculation circuit of FIG. 23.

FIG. 24 is a diagram illustrating an example of the gain control signal calculation circuit 53. As illustrated in FIG. 24, the gain control signal calculation circuit 53 includes logic circuits L5 to L8, a counter CNT, a thermometer code converter 54, and a gain adjustment termination signal generation circuit 55. Hereinafter, the latch LT3 outputs 1 when the excess has been detected at this time, and outputs 0 when the excess has not been detected at this time. Further, the latch LT4 outputs 1 when the excess has been detected at the previous time, and outputs 0 when the excess has not been detected at the previous time.

The logic circuits L5 to L8 receive the output signals of the latches LT3 and LT4. The logic circuits L5 to L8 are configured from a NAND circuit and an inverter circuit, for example.

The logic circuit L5 outputs 1 when having been input 0 from the latch LT3, and having been input 0 from the latch LT4, and outputs 0 in other cases. That is, the logic circuit L5 outputs 1 when the excess has not been detected at this time and at the previous time.

The logic circuit L6 outputs 1 when having been input 0 from the latch LT3, and having been input 1 from the latch LT4, and outputs 0 in other cases. That is, the logic circuit L6 outputs 1 when the excess has not been detected at this time, and the excess has been detected at the previous time.

The logic circuit L7 outputs 1 when having been input 1 from the latch LT3, and having been input 0 from the latch LT4, and outputs 0 in other cases. That is, the logic circuit L7 outputs 1 when the excess has been detected at this time, and the excess has not been detected at the previous time.

The logic circuit L8 outputs 1 when having been input 1 from the latch LT3, and having been input 1 from the latch LT4, and outputs 0 in other cases. That is, the logic circuit L8 outputs 1 when the excess has been detected at this time and at the previous time.

The counter CNT holds a count value according to the gain set to the amplifier circuit 4. The counter CNT receives the output signals of the logic circuits L5 to L8. The count value of the counter CNT is controlled according to output signals of the logic circuits L5 to L8.

To be specific, the count value is increased by 1 when 1 is input from the logic circuit L5. Accordingly, the gain of the amplifier circuit 4 is increased by one step (step S15). Further, the count value is unchanged when 1 is input from the logic circuit L6. Further, the count value is decreased by 1 when 1 is input from the logic circuit L7. Accordingly, the gain of the amplifier circuit 4 is decreased by one step (step S19). Further, the count value is decreased by 1 when 1 is input from the logic circuit L8. Accordingly, the gain of the amplifier circuit 4 is decreased by one step (step S17).

The thermometer code converter 54 converts the count value of the counter CNT into a thermometer code. The count value converted into the thermometer code becomes a control signal. The control signal is input to the amplifier circuit 4. Accordingly, the gain of the amplifier circuit 4 is controlled.

The gain adjustment termination signal generation circuit 55 receives the output signals of the logic circuits L6 and L7, and generates the gain adjustment termination signal when having been input 1 from the logic circuit L6 or the logic circuit L7. That is, the gain adjustment termination signal generation circuit 55 generates the gain adjustment termination signal when the termination condition (NO in step S18 or YES in step S14) has been satisfied. The gain adjustment termination signal generated by the gain adjustment termination signal generation circuit 55 is input to an external device (a device that mounts the waveform shaping filter) that controls the processing of adjusting the gain, and terminates the adjustment processing of FIG. 20. The gain adjustment termination signal generation circuit 55 is configured from an OR circuit, for example.

According to such a configuration, the maximum amplitude of the output signal Out(s) can be set to approximately accord with the third detection level. Therefore, by setting an upper limit of an input range of a circuit (an AD converter or the like) of a subsequent stage of the waveform shaping filter to the third detection level, the output signal Out(s) can be adjusted to amplitude falling within the input range of the circuit of the subsequent stage.

Note that, in the above description, the amplifier circuit 4 is connected to a subsequent stage of the filter stage 2. However, the amplifier circuit 4 may be connected between the filter stage 1 and the filter stage 2, may be included in the filter stage 1, or may be included in the filter stage 2.

Further, the first detection level, the second detection level, and the third detection level are favorably set based on a voltage of a negative input terminal of the amplifier circuit 4. The voltage of the negative input terminal of the amplifier circuit 4 is a voltage at the time of no signal (when the input signal In(s) has not arrived). Therefore, by setting the respective detection levels based on the voltage, an influence of element variation can be decreased.

(Sixth Embodiment)

Next, a waveform shaping filter according to a sixth embodiment will be described with reference to FIGS. 25 to 34. In the present embodiment, a specific example of a filter circuit used as filter stages 1 and 2 of the waveform shaping filter will be described.

Figure 25:
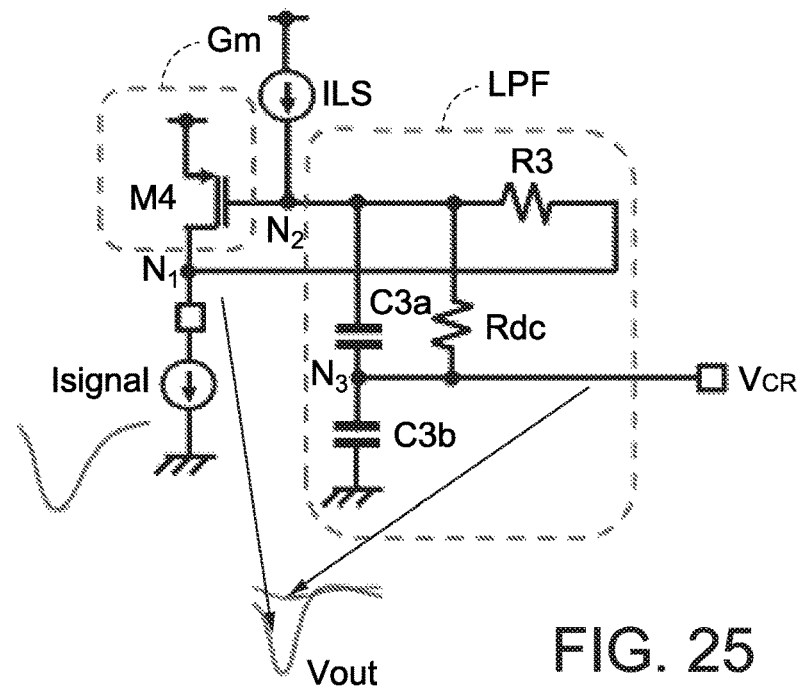
FIG. 25 is a diagram illustrating a first example of a filter circuit according to a sixth embodiment.

FIG. 25 is a diagram illustrating a first example of a filter circuit. The filter circuit of FIG. 25 includes a voltage current conversion amplifier Gm, a low pass filter LPF, and a current source ILS.

An input terminal is connected to a node $N_1$. An input current Isignal(s) is input from the input terminal, as an input signal. The input terminal also functions as an output terminal, and a voltage of the input terminal becomes an output signal of the filter circuit.

The voltage current conversion amplifier Gm has an output terminal connected to the node $N_1$, a negative input terminal connected to a node $N_2$, and a positive input terminal connected to a power supply. The node $N_1$ is connected to the input terminal of the filter circuit. The current Isignal(s) is input from the input terminal of the filter circuit, as the input signal. Further, the input terminal of the filter circuit is also used as the output terminal of the filter circuit. As the output signal of the filter circuit, a voltage Vout(s) of the input terminal of the filter circuit is output. In FIG. 25, the voltage current conversion amplifier Gm is configured from a transistor M4.

The transistor M4 is a P-channel MOS transistor (hereinafter, referred to as "PMOS"), and a drain terminal is connected to the node $N_1$, a gate terminal is connected to the node $N_2$, and a source terminal is connected to the power supply. The drain terminal, the gate terminal, and the source terminal of the transistor M4 function as the output terminal, the negative input terminal, and the positive input terminal of the voltage current conversion amplifier Gm, respectively.

The low pass filter LPF has an input terminal connected to the node $N_1$, and an output terminal connected to the node $N_2$. In FIG. 25, the low pass filter LPF includes a resistor R3, a resistor Rdc, a capacitor C3a, and a capacitor C3b.

The resistor R3 has one end connected to the node $N_1$, and the other end connected to the node $N_2$.

The resistor Rdc has one end connected to the node $N_2$, and the other end connected to a node $N_3$.

The capacitor C3a has one end connected to the node $N_2$, and the other end connected to the node $N_3$.

The capacitor C3b has one end connected to the node $N_3$, and the other end connected to a ground.

The current source ILS is a constant current source, and has one end connected to the node $N_2$ and the other end connected to the power supply.

Here, an operation of the filter circuit of FIG. 25 will be described. Hereinafter, a transfer function of the low pass filter LPF is HLPF(s), and a voltage current conversion coefficient of the voltage current conversion amplifier Gm is Gm. Further, HLPF(s)=1/(1+Sτ) is satisfied. τ is a time constant of the low pass filter LPF, and τ=C3×R3 is satisfied. Note that C3=C3a×C3b/(C3a+C3b) is satisfied. At this time, the output voltage Vout(s) is expressed as follows:

$$Vout(s)=Isignal(s)/\{Gm*HLPF(s)\}=Isignal(s)*(1+s\tau)/Gm \quad (2)$$

As can be seen from the formula (2), a filter characteristic having one zero can be realized with the filter circuit of FIG. 25. When the time constant of the filter circuit is made variable, the time constant adjustment circuit of FIG. 16 may just be connected in place of the resistor R3, or the time constant adjustment circuit of FIG. 17 may just be connected in place of the capacitors C3a and C3b.

Further, a voltage $V_{CR}$ of the node $N_3$ can be used as a first detection level. The voltage $V_{CR}$ is set according to the resistors Rdc and R3, the capacitors C3a and C3b, and the current source ILS, based on the voltage of the node $N_2$ (the negative input terminal of the voltage current conversion amplifier Gm).

To be specific, a DC component of the voltage $V_{CR}$ is a shifted voltage of the node $N_1$ by ILS×R3, and an AC component is a divided voltage of the node $N_2$ between the capacitor C3a and the capacitor C3b.

As indicated in the formula (2), the filter circuit of FIG. 25 outputs an output voltage Vout(s) that is obtained by addition of a proportional signal that is a multiplied input current Isignal(s) by 1/Gm times, and a differentiation signal that is a multiplied differentiation component Isignal(s)×s by τ/Gm times. That is, functions of a differentiation signal generation circuit, a proportional signal generation circuit, and an adder circuit are realized by the filter circuit of FIG. 25.

Figure 26:
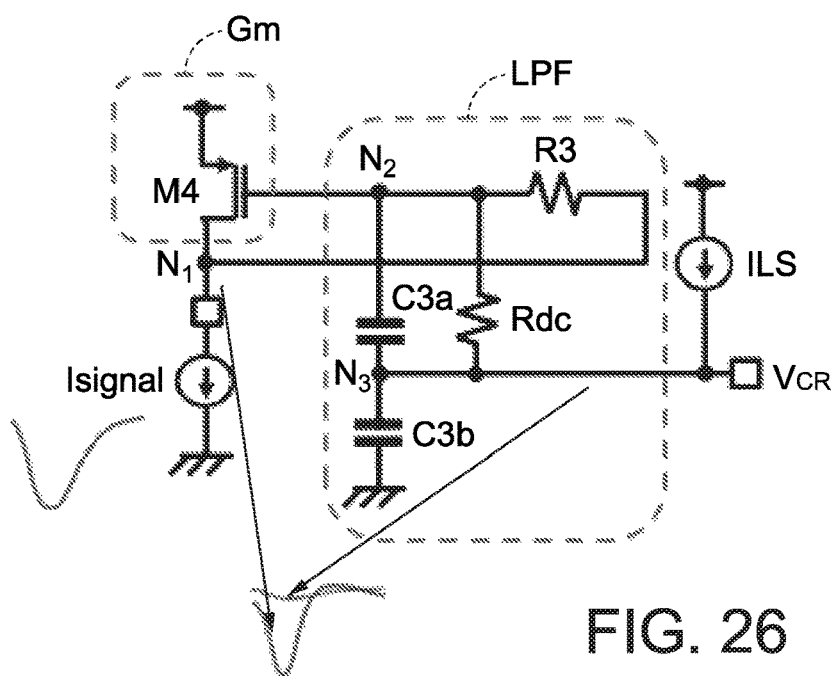
FIG. 26 is a diagram illustrating a modification of the filter circuit of FIG. 25.

FIG. 26 is a modification of the filter circuit of FIG. 25. In FIG. 26, a current source ILS has one end connected to a node $N_3$, and the other end connected to a power supply.

Other configurations are similar to those of FIG. 25. In a filter circuit of FIG. 26, a DC component of a voltage $V_{CR}$ (first detection level) is a shifted voltage of a node $N_1$ by ILS×(R3+Rdc).

Figure 27:
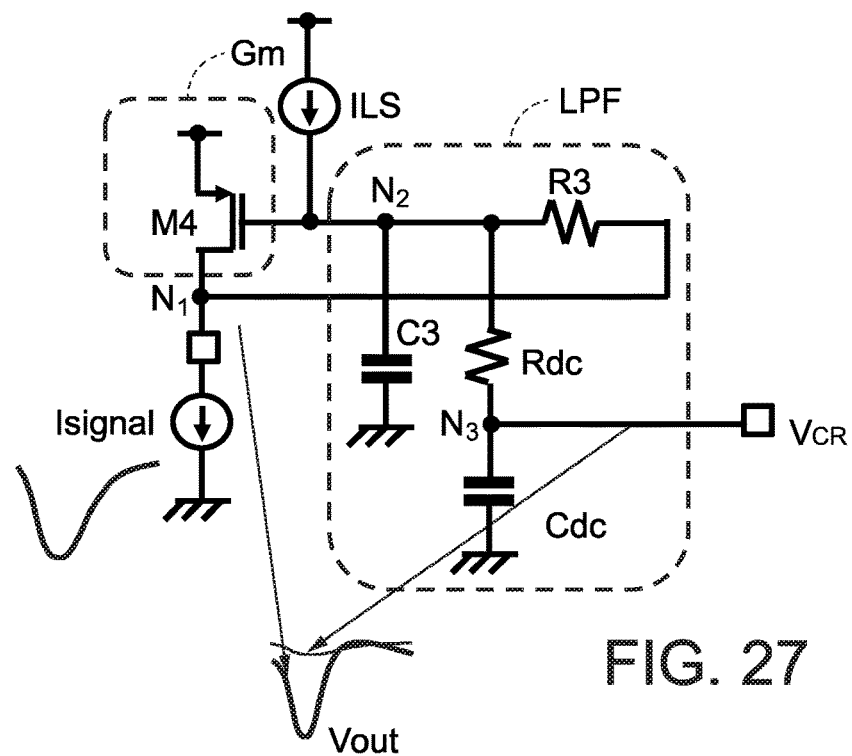
FIG. 27 is a diagram illustrating a modification of the filter circuit of FIG. 25.

FIG. 27 is a modification of the filter circuit of FIG. 25. A filter circuit of FIG. 27 includes capacitors C3 and Cdc, in place of capacitors C3a and C3b. Other configurations are similar to those of FIG. 25.

The capacitor C3 has one end connected to a node $N_2$, and the other end connected to a ground. The capacitor C3 corresponds to a series capacitor made of the capacitor C3a and the capacitor C3b of FIG. 25. That is, C3=C3a×C3b/(C3a+C3b) is satisfied. Further, the capacitor Cdc has one end connected to a node $N_3$, the other end connected to a ground.

In FIG. 27, a resistance value Rdc of a resistor Rdc is sufficiently large. A voltage $V_{CR}$ of the node $N_3$ can be used as a first detection level. The voltage $V_{CR}$ is set according to resistors Rdc and R3, the capacitor Cdc, and a current source ILS, based on a voltage of the node $N_2$ (a negative input terminal of a voltage current conversion amplifier Gm).

To be specific, a DC component of the voltage $V_{CR}$ is a shifted voltage of the node $N_1$ by ILS×R3, and an AC component is a voltage of the node $N_2$, the voltage having passed through a low pass filter LPF configured from the resistor Rdc and the capacitor Cdc.

Figure 28:
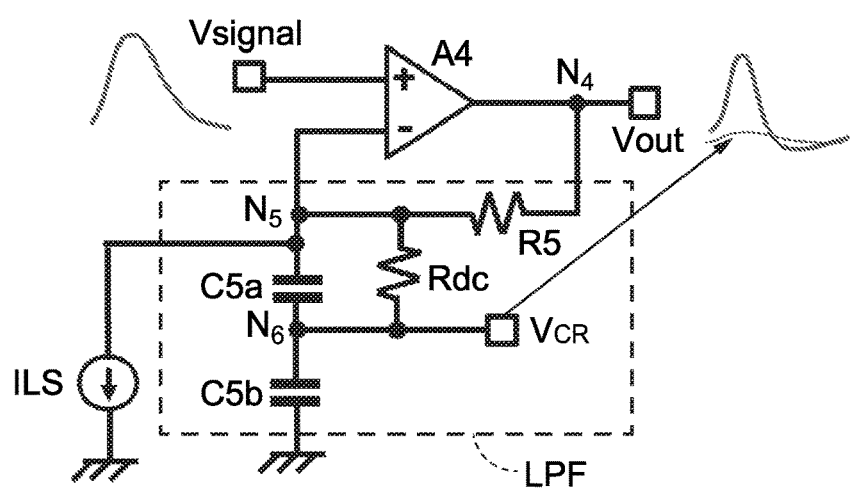
FIG. 28 is a diagram illustrating a second example of the filter circuit according to the sixth embodiment.

FIG. 28 is a diagram illustrating a second example of the filter circuit. The filter circuit of FIG. 28 includes an amplifier A4, a low pass filter LPF, and a current source ILS.

An input terminal is connected to a positive input terminal of the amplifier A4. An input voltage Vsignal(s) is applied from the input terminal, as an input signal.

An output terminal is connected to a node $N_4$. A voltage Vout(s) of the output terminal becomes an output signal of the filter circuit.

The amplifier A4 has the positive input terminal connected to the input terminal of the filter circuit, an output terminal connected to the node $N_4$, and a negative input terminal connected to a node $N_5$. The voltage Vsignal(s) is applied from the input terminal of the filter circuit, as an input signal. Further, the node $N_4$ is connected to the output terminal of the filter circuit. A voltage Vout(s) of the node $N_4$ is output as the output signal of the filter circuit.

A low pass filter LPF has an input terminal connected to the node $N_4$, and an output terminal connected to the node $N_5$. In FIG. 28, the low pass filter LPF includes a resistor R5, a resistor Rdc, a capacitor C5a, and a capacitor C5b.

The resistor R5 has one end connected to the node $N_4$, and the other end connected to the node $N_5$.

The resistor Rdc has one end connected to the node $N_5$, and the other end connected to a node $N_6$.

The capacitor C5a has one end connected to the node $N_5$, and the other end connected to the node $N_6$.

The capacitor C5b has one end connected to the node $N_6$, and the other end connected to the ground.

The current source ILS is a constant current source, and one end connected to the node $N_5$ and the other end connected to the ground.

Here, an operation of the filter circuit of FIG. 28 will be described. Hereinafter, a gain of the amplifier A4 is sufficiently large, and a resistance value Rdc of the resistor Rdc is sufficiently large. Further, a transfer function of the low pass filter LPF is HLPF(s)=1/(1+sτ). τ is a time constant of the low pass filter LPF, and τ=C5×R5 is satisfied. Note that $C5=C5a \times C5b/(C5a+C5b)$ is satisfied. At this time, the output voltage Vout(s) is expressed as follows:

$$Vout(s) \approx (1+sC5*R5)*Vsignal(s) \quad (3)$$

As can be seen from the formula (3), a filter characteristic having one zero can be realized by the filter circuit of FIG. 28. When the time constant of the filter circuit is made variable, the time constant adjustment circuit of FIG. 16 may just be connected, in place of the resistor R5, or the time constant adjustment circuit of FIG. 17 may just be connected, in place of the capacitors C5a and C5b.

Further, a voltage $V_{CR}$ of the node $N_6$ can be used as a first detection level. The voltage $V_{CR}$ is set according to the resistors Rdc and R5, the capacitors C5a and C5b, and the current source ILS, based on a voltage of the node $N_5$ (a negative input terminal of the amplifier A4).

To be specific, a DC component of the voltage $V_{CR}$ is a shifted voltage of the node $N_4$ by ILS×R5, and an AC component is a voltage of the node $N_5$, the voltage being divided between the capacitor C5a and the capacitor C5b.

Note that, as indicated in the formula (3), the filter circuit of FIG. 28 outputs an output voltage Vout(s) that is obtained by addition of a proportional signal that is a multiplied input voltage Vsignal(s) by one time, and a differentiation signal that is a multiplied differentiation component Vsignal×s by C5×R5 times. That is, functions of a differentiation signal generation circuit, a proportional signal generation circuit, and an adder circuit are realized with the filter circuit of FIG. 28.

Similarly to the case of FIG. 26, the position of the current source ILS is changed, and the current source ILS may be connected between the node $N_6$ and the ground. At this time, the DC component of the voltage $V_{CR}$ (first detection level) is a shifted voltage of the node $N_4$ by ILS×(R5+Rdc).

Figure 29:
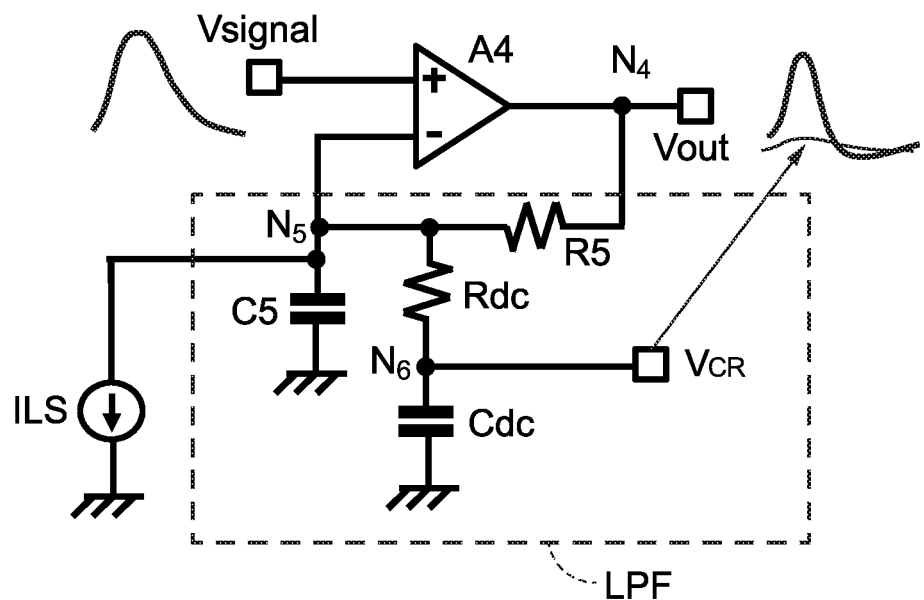
FIG. 29 is a diagram illustrating a modification of the filter circuit of FIG. 28.

FIG. 29 is a modification of the filter circuit of FIG. 28. A filter circuit of FIG. 29 includes capacitors C5 and Cdc, in place of capacitors C5a and C5b. Other configurations are similar to those of FIG. 28.

The capacitor C5 has one end connected to a node $N_5$, and the other end connected to a ground. The capacitor C5 corresponds to a series capacitor made of the capacitors C5a and C5b of FIG. 28. That is, $C5=C5a \times C5b/(C5a+C5b)$ is satisfied. Further, the capacitor Cdc has one end connected to the node $N_6$, and the other end connected to the ground.

In FIG. 29, a resistance value Rdc of a resistor Rdc is sufficiently large. A voltage $V_{CR}$ of the node $N_6$ can be used as a first detection level. The voltage $V_{CR}$ is set according to resistors Rdc and R5, the capacitor Cdc, and a current source ILS, based on a voltage of the node $N_5$ (a negative input terminal of a voltage current conversion amplifier Gm).

To be specific, a DC component of the voltage $V_{CR}$ is a shifted voltage of the node $N_4$ by ILS×R5, and an AC component is a voltage of the node $N_5$, the voltage having passed through a low pass filter configured from the resistor Rdc and the capacitor Cdc.

Figure 30:
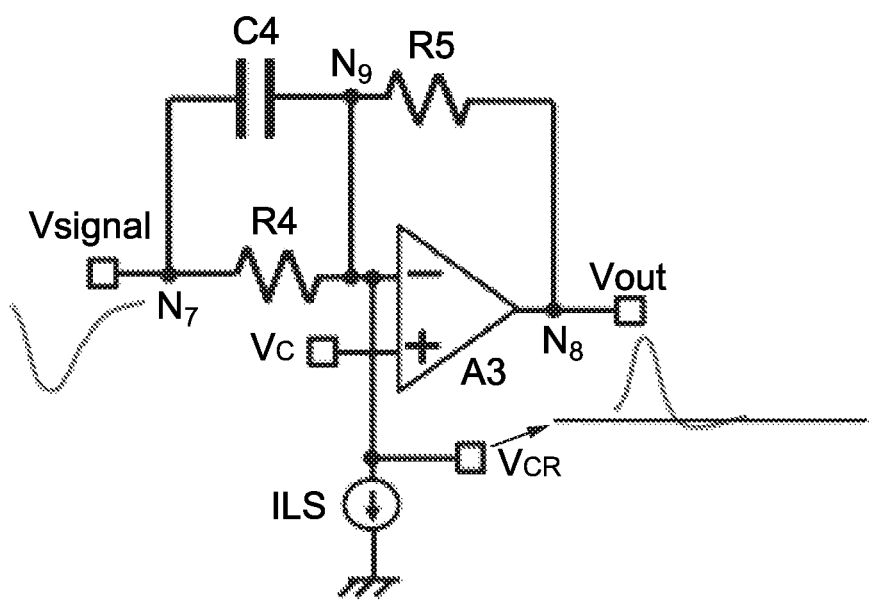
FIG. 30 is a diagram illustrating a third example of the filter circuit according to the sixth embodiment.

FIG. 30 is a diagram illustrating a third example of the filter circuit. The filter circuit of FIG. 30 includes an amplifier A3, a resistor R4, a capacitor C4, a resistor R5, and a current source ILS.

The amplifier A3 has an output terminal connected to a node $N_8$, is applied a bias voltage Vc from a positive input terminal, and has a negative input terminal connected to a node $N_9$. The node $N_8$ is connected to an output terminal of the filter circuit. A voltage Vout(s) of the node $N_8$ is output as an output signal of the filter circuit.

The resistor R4 has one end connected to a node $N_7$, and the other end connected to the node $N_9$. The node $N_7$ is connected to an input terminal of the filter circuit. A voltage Vsignal(s) is applied from the input terminal of the filter circuit, as an input signal.

The capacitor C4 has one end connected to the node $N_7$, and the other end connected to the node $N_9$.

The resistor R5 has one end connected to the node $N_8$, and the other end connected to the node $N_9$.

The current source ILS is a constant current source, and one end connected to the node $N_9$ and the other end connected to a ground.

Here, an operation of the filter circuit of FIG. 30 will be described. Hereinafter, a gain of the amplifier A3 is sufficiently large. At this time, the output voltage Vout(s) can be expressed as follows:

$$Vout(s) \approx Vsignal(s)*(1+sC4*R4)*R5/R4 \quad (4)$$

As can be seen from the formula (4), a filter characteristic having one zero can be realized with the filter circuit of FIG. 30. A time constant of the filter circuit is C4×R4. When the time constant of the filter circuit is made variable, the time constant adjustment circuit of FIG. 16 may just be connected, in place of the resistor R4, or the time constant adjustment circuit of FIG. 17 may just be connected, in place of the capacitor C4.

Further, a voltage $V_{CR}$ of the node $N_9$ (a negative input terminal of the amplifier A3) can be used as a first detection level. The voltage $V_{CR}$ is set according to the resistor R5 and the current source ILS, based on a voltage of the node $N_8$ (an output terminal of the amplifier A3). To be specific, the voltage $V_{CR}$ is a shifted voltage of the node $N_8$ by ILS×R5. Note that, in the filter circuit of FIG. 30, a voltage of the negative input terminal of the amplifier A3 and a voltage of the positive input terminal becomes approximately equal by virtual short characteristic. Therefore, a voltage (bias voltage Vc) of the positive input terminal of the amplifier A3 may be used as the first detection level.

Note that, as indicated in the formula (4), the filter circuit of FIG. 30 outputs an output voltage Vout(s) that is obtained by addition of a proportional signal that is an amplified input voltage Vsignal(s) by R5/R4 times, and a differentiation signal that is a multiplied differentiation component Vsignal×s by C4×R5 times. That is, functions of a differentiation signal generation circuit, a proportional signal generation circuit, and an adder circuit are realized with the filter circuit of FIG. 30.

Figure 31:
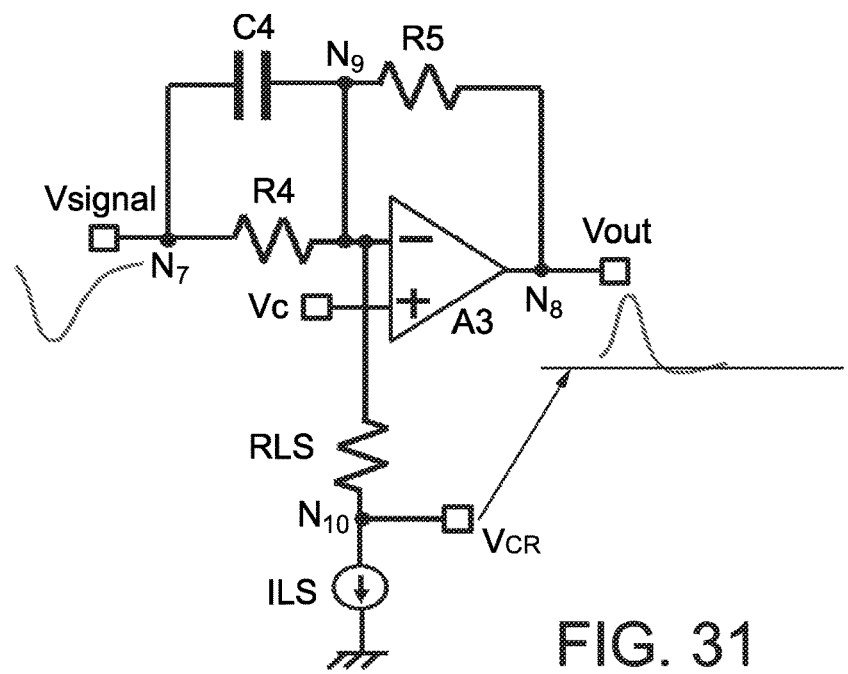
FIG. 31 is a diagram illustrating a modification of the filter circuit of FIG. 30.

FIG. 31 is a modification of the filter circuit of FIG. 30. A filter circuit of FIG. 31 includes a resistor RLS. The resistor RLS has one end connected to a node $N_9$, and the other end connected to a node $N_{10}$. A current source ILS has one end connected to the node $N_{10}$, and the other end connected to a ground. Other configurations are similar to those of FIG. 30.

In the filter circuit of FIG. 31, a voltage $V_{CR}$ of the node $N_{10}$ may be used as a first detection level. At this time, the voltage $V_{CR}$ is a shifted voltage of the node $N_9$ (a negative input terminal of an amplifier A3) by ILS×Rdc.

Figure 32:
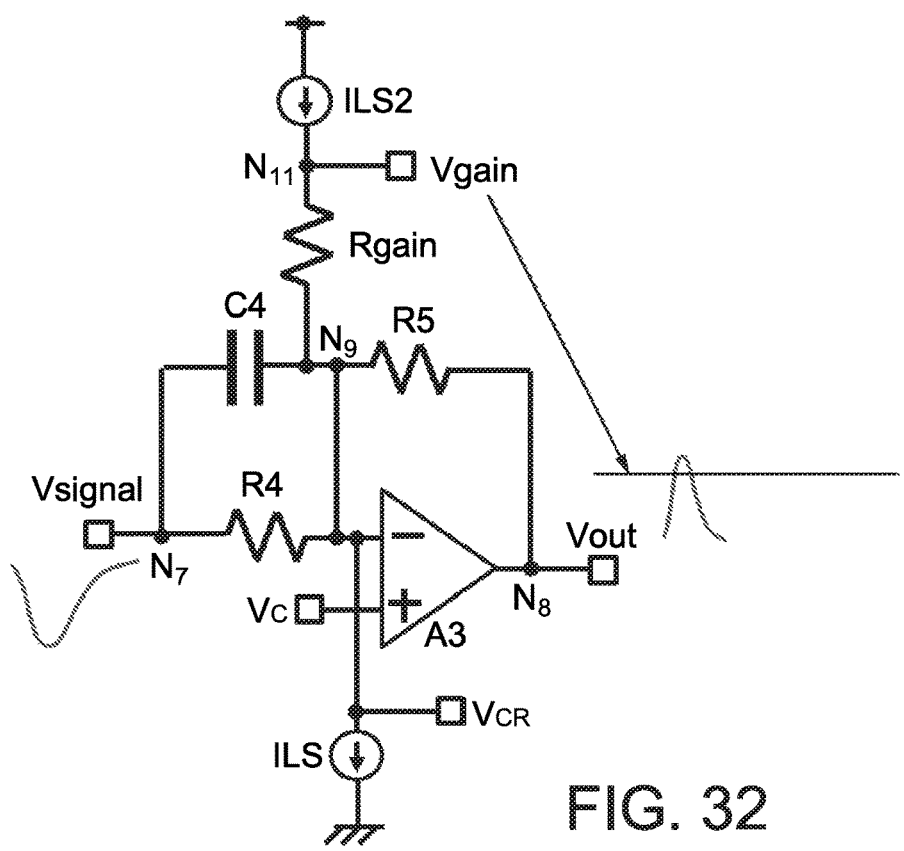
FIG. 32 is a diagram illustrating a fourth example of the filter circuit according to the sixth embodiment.

FIG. 32 is a diagram illustrating a fourth example of the filter circuit. The filter circuit of FIG. 32 includes a resistor Rgain and a current source ILS2. The resistor Rgain has one end connected to a node $N_9$, and the other end connected to a node $N_{11}$. The current source ILS2 is a constant current source, and has one end connected to the node $N_{11}$, and the other end connected to a power supply. Other configurations are similar to those of FIG. 30.

In the filter circuit of FIG. 32, a voltage Vgain of the node $N_{11}$ can be used as a third detection level. The voltage Vgain is set according to the resistor Rgain and the current source ILS2, based on a voltage of the node $N_9$ (a negative input terminal of the amplifier A3). To be specific, the voltage Vgain is a shifted voltage of the node $N_9$ by ILS2×Rgain.

Figure 33:
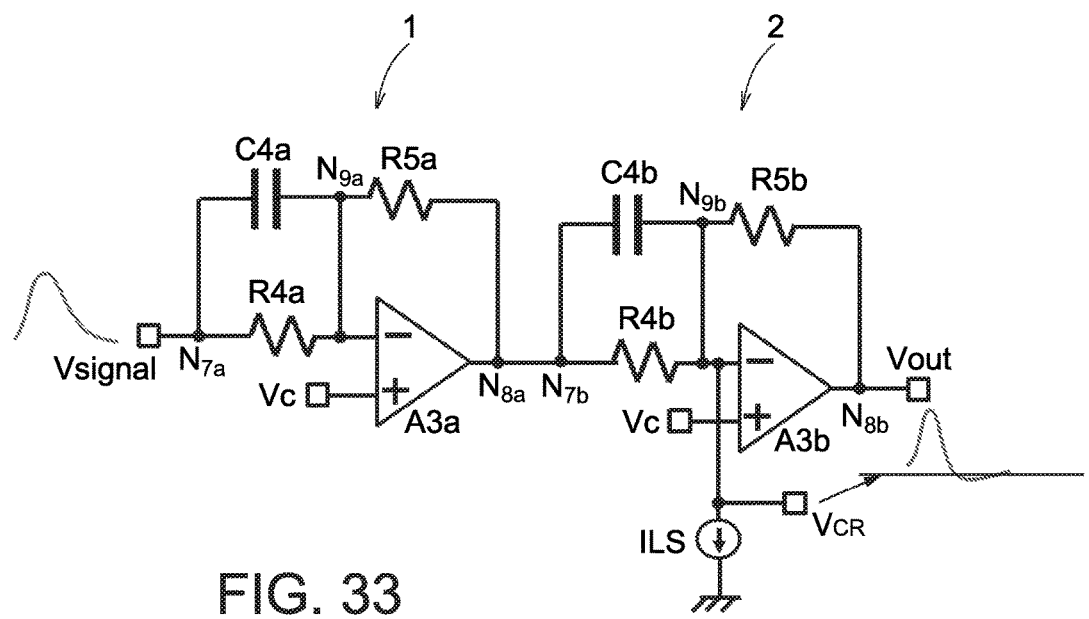
FIG. 33 is a diagram illustrating a fifth example of the filter circuit according to the sixth embodiment.

FIG. 33 is a diagram illustrating a fifth example of the filter circuit. The filter circuit of FIG. 33 includes a filter stage 1 and a filter stage 2. The filter stages are the filter circuit of FIG. 30.

The filter stage 1 includes an amplifier A3a, a resistor R4a, a capacitor C4a, and a resistor R5a. Configurations of the filter stage 1 respectively correspond to the amplifier A3, the resistor R4, the capacitor C4, and the resistor R5 of the filter circuit of FIG. 30.

The filter stage 2 includes an amplifier A3b, a resistor R4b, a capacitor C4b, a resistor R5b, and a current source ILS. Configurations of the filter stage 2 respectively correspond to the amplifier A3, the resistor R4, the capacitor C4, the resistor R5, and the current source ILS of the filter circuit of FIG. 30.

Here, an operation of the filter circuit of FIG. 33 will be described. Hereinafter, an input signal of the filter circuit of FIG. 33 is a voltage Vsignal(s), and an output signal is a voltage Vout(s). Further, gains of the amplifiers A3a and A3b are sufficiently large. At this time, the output voltage Vout(s) is expressed as follows:

$$Vout(s) \approx Vsignal(s)*(1+sC4a*R4a)(1+sC4b*R4b)*R5a*R5b/(R4a*R4b) \quad (5)$$

As can be seen from the formula (5), a filter characteristic having two zeros can be realized with the filter circuit of FIG. 33. Time constants of the filter circuit are C4a×R4a and C4b×R4b. When the time constants of the filter circuit are made variable, the time constant adjustment circuit of FIG. 16 may just be connected, in place of the resistors R4a and R4b, or the time constant adjustment circuit of FIG. 17 may just be connected, in place of the capacitors C4a and C4b.

Further, similarly to the filter circuit of FIG. 30, a voltage of a negative input terminal of the amplifier A3b, or a voltage Vc of a positive input terminal can be used as a first detection level.

Figure 34:
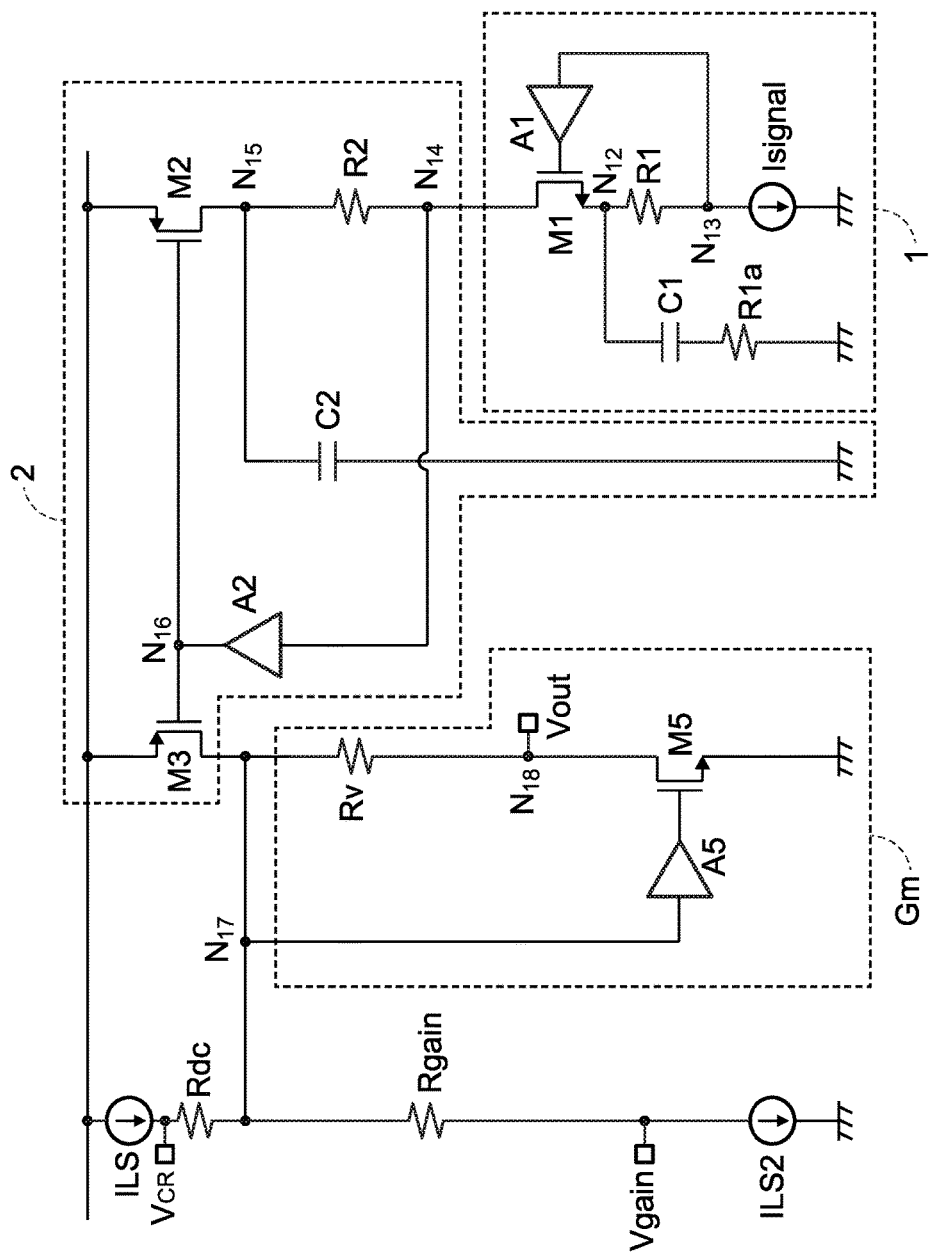
FIG. 34 is a diagram illustrating a sixth example of the filter circuit according to the sixth embodiment.

FIG. 34 is a diagram illustrating a sixth example of the filter circuit. A filter circuit of FIG. 34 includes a filter stage 1, a filter stage 2, a current-to-voltage conversion circuit Gm, a resistor Rdc, a current source ILS, a resistor Rgain, and a current source ILS2.

The filter stage 1 includes a resistor R1, a transistor M1, an inverting amplifier A1, a capacitor C1, and a resistor R1a.

The resistor R1 has one end connected to a node $N_{12}$, and the other end connected to a node $N_{13}$. The node $N_{13}$ is connected to an input terminal of the filter stage 1 (filter circuit). A current Isignal(s) is input from the input terminal of the filter circuit, as an input signal. The input current Isignal(s) is converted into a voltage with the resistor R1.

The transistor M1 is a N-channel MOS transistor (hereinafter, referred to as "NMOS"), and has a source terminal connected to the node $N_{12}$, a gate terminal connected to an output terminal of the inverting amplifier A1, and a drain terminal connected to a node $N_{14}$. The node $N_{14}$ serves as an output terminal of the filter stage 1. A drain current I1(s) of the transistor M1 is output from the output terminal of the filter stage 1, as an output signal.

The inverting amplifier A1 has a negative input terminal connected to the node $N_{13}$, and an output terminal connected to a gate terminal of the transistor M1.

The capacitor C1 has one end connected to the node $N_{12}$, and the other end connected to a one end of the resistor R1a.

The resistor R1a has the one end connected to the other end of the capacitor C1, and the other end connected to a ground.

The filter stage 1 has a configuration in which an output of the inverting amplifier A1 is fed back to an input of the inverting amplifier A1 through the transistor M1 and the resistor R1. Therefore, the negative input terminal of the inverting amplifier A1 becomes a virtual ground, and input impedance as seen from the input terminal (node $N_{13}$) of the filter stage 1 becomes (1+gm1×R1)/{gm1×(1+A1)}. gm1 is transconductance of the transistor M1 and A1 is a gain of the inverting amplifier A1. Typically, A1 is extremely large, and thus the input impedance becomes extremely small, and the input voltage of the inverting amplifier A1 becomes approximately constant.

Therefore, a signal voltage of a source terminal of the transistor M1 becomes Isignal(s)×R1, and a current flowing in the capacitor C1 becomes Isignal×sC1×R1/(1+sC1×R1a). The drain current I1(s) of the transistor M1 becomes a sum of the current flowing in the capacitor C1 and the current Isignal(s), and is expressed as follows:

$$I1(s) = Isignal(s)*\{1+sC1*(R1+R1a)\}/(1+sC1*R1a) \quad (6)$$

As can be seen from the formula (6), a filter characteristic having one zero can be realized with the filter stage 1 of FIG. 34. A time constant of the filter stage 1 becomes C1×(R1+R1a). When the time constant of the filter stage 1 is made variable, the time constant adjustment circuit of FIG. 16 may be connected, in place of the resistors R1 and R1a, or the time constant adjustment circuit of FIG. 17 may be connected, in place of the capacitor C1.

Further, in the example of FIG. 34, the resistor R1a and the capacitor C1 are connected in series so that a voltage applied to the resistor R1 is decreased, and the filter circuit can be operated with a lower power supply voltage. However, the filter stage 1 can have a configuration without including the resistor R1a. In this case, the one end of the capacitor C1 may just be connected to the node $N_{12}$, and the other end may just be connected to a ground.

As indicated in the formula (6), the filter stage 1 of FIG. 34 outputs an output current I1(s) that is obtained by addition of a proportional signal and a differentiation signal generated from the input current Isignal(s). That is, functions of the differentiation signal generation circuit 11, the proportional signal generation circuit 12, and the adder circuit 13 shown in FIG. 23 are realized with the filter stage 1 of FIG. 34.

The filter stage 2 includes a resistor R2, a transistor M2, a non-inverting amplifier A2, a capacitor C2, and a transistor M3.

The resistor R2 has one end connected to the node $N_{14}$, and the other end connected to a node $N_{15}$. The node $N_{14}$ serves as an input terminal of the filter stage 2. The drain current I1(s) is input from the input terminal of the filter stage 2, as an input signal. The drain current I1(s) is converted into a voltage of the resistor R2.

The transistor M2 is a PMOS, and has a drain terminal connected to the node $N_{15}$, a gate terminal connected to a node $N_{16}$, and a source terminal connected to a power supply.

The non-inverting amplifier A2 has an input terminal connected to the node $N_{14}$, and an output terminal connected to the node $N_{16}$.

The capacitor C2 has one end connected to the node $N_{15}$, and the other end connected to the ground.

The transistor M3 is a PMOS, and has a drain terminal connected to a node $N_{17}$, a gate terminal connected to the node $N_{16}$, and a source terminal connected to the power supply. The node $N_{17}$ serves as an output terminal of the filter stage 2. A drain current I3(s) of the transistor M3 is output from the output terminal of the filter stage 2, as an output signal.

The transistor M3 configures a current mirror circuit together with the transistor M2. Therefore, the drain current I3(s) of the transistor M3 becomes a current of device size ratio times of a drain current I2(s) of the transistor M2.

The filter stage 2 has a configuration in which an output of the non-inverting amplifier A2 is fed back to an input of the non-inverting amplifier A2 through the transistor M2 and the resistor R2. Therefore, the input terminal of the non-inverting amplifier A2 becomes a virtual ground, and input impedance as seen from the input terminal (node $N_{14}$) of the filter stage 2 becomes (1/gm2)/A2. gm2 is transconductance of the transistor M2, A2 is a gain of the non-inverting amplifier A2. Typically, A2 is extremely large and thus the input impedance becomes extremely small, and an input voltage of the non-inverting amplifier A2 becomes approximately constant.

Therefore, a signal voltage of the drain terminal of the transistor M2 becomes I1(s)×R2, and a current flowing in the capacitor C2 becomes I(s)×sC2×R2. The drain current I2(s) of the transistor M2 becomes a sum of the current flowing in the capacitor C2 and the current I1(s), and is expressed as follows:

$$I2(s)=I1(s)*(1+sC2*R2) \quad (7)$$

When device sizes of the transistor M2 and the transistor M3 are the same, I2(s)=I3(s) is satisfied. At this time, a drain current I3(s) output by the filter stage 2 is expressed as follows:

$$I3(s)=I2(s)=Isignal(s)*\{1+sC1*(R1+R1a)\}*(1+sC2*R2)/(1+sC1*R1a) \quad (8)$$

As can be seen from the formula (8), a filter characteristic having two zero can be realized with the filter stages 1 and 2. A time constant of the filter stage 2 becomes C2R2. When the time constant of the filter stage 2 is made variable, the time constant adjustment circuit of FIG. 16 may just be connected, in place of the resistor R2, or the time constant adjustment circuit of FIG. 17 may just be connected, in place of the capacitor C2.

As indicated in the formula (8), the filter stage 2 of FIG. 34 outputs an output current I3(s) that is obtained by addition of a proportional signal and a differentiation signal generated from the input current I1(s). That is, functions of the differentiation signal generation circuit 21, the proportional signal generation circuit 22, and the adder circuit 23 shown in FIG. 23 are realized with the filter stage 2 of FIG. 34.

The current-to-voltage conversion circuit Gm outputs the drain current I3(s) into a voltage and outputs the voltage. The current-to-voltage conversion circuit Gm includes a resistor Rv, a transistor M5, and a non-inverting amplifier A5.

The resistor Rv has one end connected to the node $N_{17}$, and the other end connected to a node $N_{18}$. The node $N_{18}$ is connected to an output terminal of the filter circuit. A voltage Vout(s) is output from the output terminal, as an output signal. The resistor Rv converts the drain current I3(s) into a voltage to generate an output voltage Vout(s).

The transistor M5 is an NMOS, and has a drain terminal connected to the node $N_{18}$, a gate terminal connected to an output terminal of the non-inverting amplifier A5, and a source terminal connected to the ground. The transistor M5 is operated as a common-source amplifier circuit. The common-source amplifier circuit is an inverting amplifier circuit.

The non-inverting amplifier A5 has a positive input terminal connected to the node $N_{17}$, and an output terminal connected to a gate terminal of the transistor M5. The common-source amplifier circuit by the transistor M5 and the non-inverting amplifier circuit A5 are cascade-connected, and form the inverting amplifier circuit as a whole. Therefore, the positive input terminal of the non-inverting amplifier A5 is a negative input terminal when the entire circuit is seen as the inverting amplifier circuit.

The current-to-voltage conversion circuit Gm forms the inverting amplifier circuit with the non-inverting amplifier circuit A5 and the transistor M5, as described above, and has a configuration in which an output is fed back from the drain terminal of the transistor M5 that is an output of the inverting amplifier circuit to an input of the non-inverting amplifier A5 through the resistor Rv. Therefore, the positive input terminal of the non-inverting amplifier A5 becomes a virtual ground, and input impedance as seen from the output terminal (node $N_{17}$) of the filter stage 2 becomes (1/gm5)/A5. gm5 is transconductance of the transistor M5 and A5 is a gain of the non-inverting amplifier A5. Typically, A5 is extremely large and thus the input impedance becomes extremely small, and an input voltage of the non-inverting amplifier A5 becomes approximately constant.

Therefore, a signal voltage Vout of the drain terminal of the transistor M5 becomes a shifted voltage of the node $N_{17}$ by I3(s)×Rv.

The resistor Rdc has one end connected to the node $N_{17}$, and the other end connected to one end of the current source ILS.

The current source ILS is a constant current source, and has the one end connected to the other end of the resistor Rdc and the other end connected to the power supply.

The resistor Rgain has one end connected to the node $N_{17}$, and the other end connected to one end of the current source ILS2.

The current source ILS2 is a constant current source, and has the one end connected to the other end of the resistor Rgain and the other end connected to the ground.

In the filter circuit of FIG. 34, a voltage $V_{CR}$ of the other end of the resistor Rdc can be used as a first detection level. The voltage $V_{CR}$ is a shifted voltage of the node $N_{17}$ (the negative input terminal of the non-inverting amplifier A5) by ILS×Rdc.

Further, a voltage Vgain of the other end of the resistor Rgain can be used as a third detection level. The voltage Vgain is a shifted voltage of the node $N_{17}$ (the negative input terminal of the non-inverting amplifier A5) by ILS2×Rgain.

(Seventh Embodiment)

Figure 35:
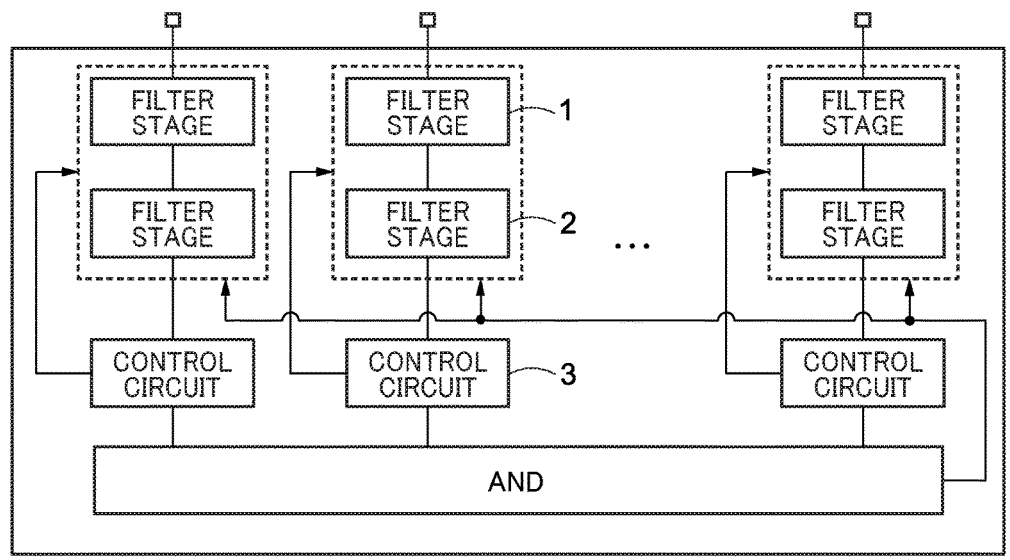
FIG. 35 is a diagram illustrating an integrated circuit according to a seventh embodiment.

Next, an integrated circuit according to a seventh embodiment will be described with reference to FIG. 35. An integrated circuit according to the present embodiment is a plurality of the above-described waveform shaping filters integrated on the same chip. As illustrated in FIG. 35, the integrated circuit includes the plurality of waveform shaping filters, and an AND circuit AND. In FIG. 35, each of the waveform shaping filters includes filter stages 1 and 2. However, as described above, the waveform shaping filter may just include two or more filter stages.

The AND circuit AND receives detection results of an undershoot from control circuits 3 of the respective waveform shaping filters. The AND circuit AND outputs a control signal when all of the detection results of the undershoot are the same, and executes control of the time constants of all of the filter stages of the respective waveform shaping filters.

The case where all of the detection results are the same means a case where the undershoot has been detected in all of the waveform shaping filters, or a case where the undershoot has not been detected in all of the waveform shaping filters.

In the example of FIG. 35, the control signal output by the AND circuit AND is input to the filter stages 1 and 2 of each waveform shaping filter. However, the AND circuit AND may input the control signal to the control circuit 3 of each waveform shaping filter, and may cause the control circuit 3 to execute the control of the time constant.

Here, an operation of the integrated circuit of FIG. 35 will be described. Each waveform shaping filter on the integrated circuit detects the undershoot of an output signal Out(s) when having been input an input signal In(s), and adjusts the time constant by one step at a time. Therefore, when the integrated circuit includes the plurality of waveform shaping filters, and each waveform shaping filter includes the filter stage 1 and the filter stage 2, as illustrated in FIG. 35, the time constant of each filter stage needs to be adjusted. Therefore, the number of times of adjustment processing is increased, and it takes time to perform the adjustment processing.

Typically, relative variation of resistance values and capacitance values is small, but variation of absolute values is large. Therefore, when all of the detection results of the undershoot are the same in the same chip, it can be considered that deviation of the time constants of the waveform shaping filters include deviation caused by deviation of the absolute values of the resistance and the capacitance of the integrated circuit.

Therefore, the integrated circuit according to the present embodiment controls the time constants of the filter stage 1 and the filter stage 2 of the waveform shaping filters at the same time when all of the detection results of the undershoot are the same. Accordingly, the deviation of the time constants caused by deviation of the absolute values is adjusted.

By controlling the time constants as described above, the number of times of the adjustment processing by the control circuits 3 is decreased, and the time of the adjustment processing can be reduced.

Note that the AND circuit AND is integrated on the same chip as the waveform shaping filters in FIG. 35. However, the AND circuit AND may be integrated on a different chip. Further, the processing by the AND circuit AND may be realized by software.

(Eighth Embodiment)

Figure 36:
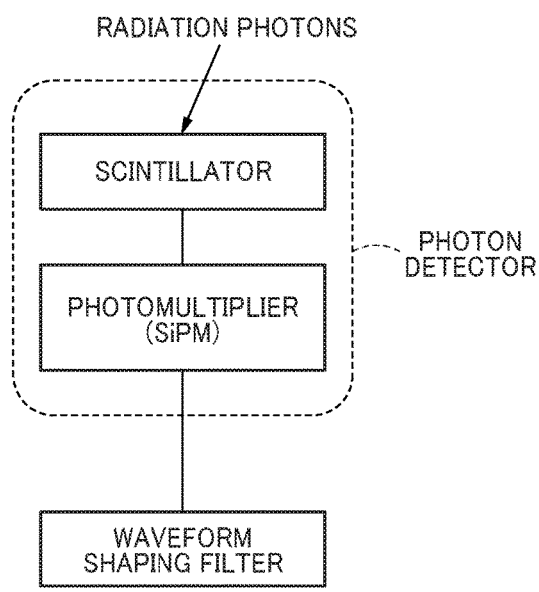
FIG. 36 is a diagram illustrating a radiation detection device according to an eighth embodiment.

Next, a radiation detection device according to an eighth embodiment will be described with reference to FIG. 36. FIG. 36 is a diagram illustrating a radiation detection device according to the present embodiment. As illustrated in FIG. 36, the radiation detection device includes a photon detector and the above-described waveform shaping filter.

The photon detector outputs a charge amount proportional to energy of incident radiation photons, as a pulse signal current Isignal. As illustrated in FIG. 36, the photon detector includes a scintillator and a photomultiplier.

The scintillator generates scintillation light according to the energy of incident radiation photons. The scintillator has a low pass characteristic caused by decay time of the scintillation light. Hereinafter, the time constant of the scintillator is $\tau 1$, and the low pass characteristic is $1/(1+s\tau 1)$.

The photomultiplier (SiPM) outputs the charge amount according to the energy of the scintillation light generated by the scintillator, ad a pulse signal current Isignal. Typically, the photomultiplier has a low pass characteristic. Hereinafter, the time constant of the photomultiplier is $\tau 2$, and the low pass characteristic is $1/(1+s\tau 2)$.

The waveform shaping filter receives the signal current Isignal, as an input signal In(s), and outputs an output signal Out(s) according to the signal current Isignal.

For example, when the photon detector includes the scintillator of the time constant $\tau 1$ and the photomultiplier of the time constant $\tau 2$, like the radiation detection device of FIG. 36, the waveform shaping filter favorably includes a first filter stage 1 having the time constant $\tau 1$, and a second filter stage 2 having the time constant $\tau 2$.

With such a configuration, the low pass characteristic that the signal current Isignal has is cancelled by the filter characteristic of the waveform shaping filter, and unsharpness of the signal current Isignal (a pulse width is expanded) unsharpened due to the low pass characteristic is removed, and the pulse width can be narrowed.

Note that similar effects can be obtained when the time constant of the first filter stage 1 is caused to be $\tau 2$, and the time constant of the second filter stage 2 is caused to be $\tau 1$. Further, when the low pass characteristic of the signal current Isignal has one time constant, or three or more time constants, the waveform shaping filter may just include the same number of filter stage(s) as the number of the time constant(s) to cause the time constant(s) of the filter stage(s) to accord with the time constant(s) of the low pass characteristic.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A waveform shaping filter comprising:
   a filter stage comprising:
      a differentiation signal generation circuit which generates a differentiation signal by amplifying a signal obtained by differentiating an input signal,
      a proportional signal generation circuit which generates a proportional signal by amplifying the input signal, and
      an adder circuit which outputs an output signal obtained by adding the proportional signal and the differentiation signal; and
   a control circuit connected to the filter stage, the control circuit comparing the output signal and a first value so as to detect an overshoot or an undershoot of the output signal, and controlling a time constant of the filter stage, based on whether the overshoot or the undershoot of the output signal has been detected.

2. The filter according to claim 1, wherein:
   the control circuit makes the time constant of the filter stage small when having detected the overshoot or the undershoot.

3. The filter according to claim 1, wherein:
   the control circuit makes the time constant of the filter stage large when having not detected the overshoot or the undershoot.

4. The filter according to claim 1, wherein the control circuit comprises:

a first comparator which compares the output signal and the first detection level, and a first holding circuit which holds a comparison result by the first comparator.

5. The filter according to claim 4, wherein:

adjustment processing of the time constant is performed a plurality of times, the first holding circuit holds the comparison result by the first comparator in the adjustment processing of a current time; and the control circuit further comprises:

a second holding circuit which holds the comparison result by the first comparator in the adjustment processing of a previous time.

6. The filter according to claim 5, wherein the control circuit further comprises:

a counter which holds a count value according to the time constant, and a logic circuit which charges the count value according to the comparison result held in the first holding circuit and the comparison result held in the second holding circuit.

7. The filter according to claim 5, wherein the control circuit further comprises:

an adjustment termination signal generation circuit which generates a signal for terminating the adjustment processing, based on the comparison result held in the first holding circuit and the comparison result held in the second holding circuit.

8. The filter according to claim 1, wherein:

the filter stage further comprises a time constant adjustment circuit comprising a plurality of resistors connected in parallel, and a plurality of switches that connect or release the respective resistors, and the control circuit adjusts the time constant of the filter stage by controlling opening/closing of the switches of the time constant adjustment circuit.

9. The filter according to claim 1, wherein:

the filter stage further comprises a time constant adjustment circuit comprising a plurality of capacitors connected in parallel, and a plurality of switches that connect or release the respective capacitors, and the control circuit adjusts the time constant of the filter stage by controlling opening/closing of the switches of the time constant adjustment circuit.

10. The filter according to claims 1, wherein the control circuit comprises:

a first counter which counts a number of times of the overshoot or the undershoot detected by comparison between the output signal and the first value, a second counter which counts a number of arrival times of the input signal detected by comparison between the output signal and a second value, and a determination circuit which compares a ratio of a count value of the first counter to a count value of the second counter, and a predetermined threshold.

11. The filter according to claim 1, further comprising:

an amplifier circuit connected subsequent to the filter stage, or comprised in the filter stage.

12. The filter according to claim 11, further comprising:

a gain control circuit which compares the output signal and a third value, detects whether the output signal has exceeded the third value, and controls a gain of the amplifier circuit, based on a detection result.

13. The filter according to claim 11, wherein:

at least one of the first value, the second value, and the third value is set based on a voltage of a negative input terminal of the amplifier circuit.

14. The filter according to claim 12, wherein the gain control circuit comprises:

a second comparator which compares the output signal and the third value, and a third holding circuit which holds a comparison result by the second comparator.

15. The filter according to claim 14, wherein:

adjustment processing of the gain is performed a plurality of times, the third holding circuit holds a comparison result by the second comparator in the adjustment processing of a current time, and the gain control circuit further comprises:

a fourth holding circuit which holds a comparison result by the second comparator in the adjustment processing of a previous time.

16. The filter according to claim 15, wherein the gain control circuit further comprises:

a counter which holds a count value according to the gain; and a logic circuit which changes the count value according to the comparison result held in the third holding circuit and the comparison result held in the fourth holding circuit.

17. The filter according to claim 15, wherein the gain control circuit further comprises:

a gain adjustment termination signal generation circuit which generates a signal for terminating the adjustment processing, based on the comparison result held in the third holding circuit and the comparison result held in the fourth holding circuit.

18. An integrated circuit comprising:

a first filter; and a second filter, wherein at least one of the first filter and the second filter comprises:

a filter stage comprising:

a differentiation signal generation circuit which generates a differentiation signal by amplifying a signal obtained by differentiating an input signal;

a proportional signal generation circuit which generates a proportional signal by amplifying the input signal; and an adder circuit which adds the proportional signal and the differentiation signal to output an output signal; and a control circuit connected to the filter stage, the control circuit comparing the output signal and a first value to detect an overshoot or an undershoot of the output signal, and controlling a time constant of the filter stage, based on whether the overshoot or the undershoot of the output signal has been detected.

19. The integrated circuit according to claim 18, wherein:

when detection results of the overshoot or the undershoot in the first and second filters are the same, the time constant of the filter stage in the first and second filters is adjusted.

20. A radiation detection device comprising:

a photon detector which detects radiation photons and outputs a current signal proportional to energy of the incident radiation photons; and a filter which receives the current signal, wherein the filter comprises:
a filter stage comprising:
  a differentiation signal generation circuit which generates a differentiation signal by amplifying a signal obtained by differentiating the current signal;
  a proportional signal generation circuit which generates a proportional signal by amplifying the current signal; and
  an adder circuit which adds the proportional signal and the differentiation signal to output an output signal; and
a control circuit connected to the filter stage, the control circuit comparing the output signal and a first value to detect an overshoot or an undershoot of the output signal, and controlling a time constant of the filter stage, based on whether the overshoot or the undershoot of the output signal has been detected.

21. The radiation detection device according to claim 20, wherein:
the control circuit controls the time constant of the filter to become equal to a time constant of the photon detector.

* * * * *